(12) United States Patent
Takahashi et al.

(10) Patent No.: US 9,160,195 B2
(45) Date of Patent: Oct. 13, 2015

(54) CHARGING DEVICE

(71) Applicant: SEMICONDUCTOR ENERGY LABORATORY CO., LTD., Atsugi-shi, Kanagawa-ken (JP)

(72) Inventors: Kei Takahashi, Kanagawa (JP); Kazunori Watanabe, Kanagawa (JP); Minoru Takahashi, Nagano (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 176 days.

(21) Appl. No.: 13/930,099

(22) Filed: Jun. 28, 2013

(65) Prior Publication Data

US 2014/0021904 A1    Jan. 23, 2014

(30) Foreign Application Priority Data

Jul. 17, 2012  (JP) ................................. 2012-158370

(51) Int. Cl.
    *H02J 7/00*    (2006.01)
(52) U.S. Cl.
    CPC ............. *H02J 7/0083* (2013.01); *H02J 7/0078* (2013.01); *H01L 2924/0002* (2013.01)
(58) Field of Classification Search
    CPC .................................... H02J 7/04; H02J 7/007
    USPC .................................. 320/107, 112, 128, 132
    See application file for complete search history.

(56) References Cited

U.S. PATENT DOCUMENTS

| 5,808,446 A * | 9/1998 | Eguchi .......................... 320/134 |
| 6,118,253 A * | 9/2000 | Mukainakano et al. ...... 320/134 |
| 7,674,650 B2 | 3/2010 | Akimoto et al. |
| 2006/0210868 A1 | 9/2006 | Kim et al. |
| 2010/0264883 A1* | 10/2010 | Aiura ............................ 320/150 |
| 2011/0241625 A1* | 10/2011 | LoCascio ...................... 320/140 |

FOREIGN PATENT DOCUMENTS

| JP | 2004-364419 | 12/2004 |
| JP | 2006-269426 | 10/2006 |

OTHER PUBLICATIONS

Sekine.Y et al., "Success in Measurement the Lowest Off-State Current of Transistor in the World,", ECS Transactions, 2011, vol. 37, No. 1, pp. 77-88.

(Continued)

*Primary Examiner* — Paul Dinh
(74) *Attorney, Agent, or Firm* — Nixon Peabody LLP; Jeffrey L. Costellia

(57) ABSTRACT

A charging device used for charging a storage battery includes a first circuit that generates a current which depends on a charging current of the storage battery; a second circuit in which charge is accumulated by periodical supply of the current which depends on the charging current; and a third circuit that outputs a signal indicating completion of charge of the storage battery when the potential of the second circuit reaches a reference potential. The second circuit includes a capacitor and a transistor in which an oxide semiconductor is used for a channel formation region. The transistor is turned on or off in response to a pulse signal input to a gate of the transistor. The capacitor accumulates charge when the current depending on the charging current flows through the transistor.

12 Claims, 10 Drawing Sheets

(56) References Cited

OTHER PUBLICATIONS

Murakami.M et al., "Theoretical Examination on a Significantly Low Off-State Current of a Transistor Using Crystalline In—Ga—Zn—Oxide,", in Proc. AM-FPD'12 Dig., Jul. 2012, pp. 171-174.

Murakami.M et al., "Theoretical Examination on Significantly Low Off-State Current of a Transistor Using Crystalline In—Ga—Zn—Oxide,", Ext. Abstr. Solid States Devices and Materials, Kyoto, 2012, pp. 320-321.

Yamazaki.S et al., "Research, Development, and Application of Crystalline Oxide Semiconductor,", SID Digest '12 : SID International Symposium Digest of Technical Papers, Jun. 3, 2012, pp. 183-186.

Nishijima.T et al., "Low-power Display System Driven by Utilizing Technique Using Crystalline IGZO Transistor,", SID Digest '12 : SID International Symposium Digest of Technical Papers, 2012, pp. 583-586.

Matsuzaki.T et al., "1Mb Non-Volatile Random Access Memory Using Oxide Semiconductor,", IMW 2011 (3rd IEEE International Memory Workshop), May 22, 2011, pp. 185-188.

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's ,", IEEE Transactions on Electron Devices, Jun. 1, 1994, vol. 41, No. 6, pp. 926-931.

\* cited by examiner

CHARGING DEVICE

BACKGROUND OF THE INVENTION

1. Field of the Invention

The present invention relates to an object, a method, a manufacturing method, a process, a machine, or manufacture. In particular, the present invention relates to, for example, a semiconductor device, a display device, a light-emitting device, a power storage device, a driving method thereof, or a manufacturing method thereof. In particular, the present invention relates to a charging device of a storage battery.

2. Description of the Related Art

In recent years, storage batteries such as lithium secondary batteries have been widely used as power supplies for portable terminals typified by mobile phones and smartphones and power supplies for motor driven electric vehicles and the like (see Patent Document 1).

As charging devices for such storage batteries, a charging device which determines whether charge is completed by measuring the voltage of a terminal of the storage battery and a charging device which determines whether charge is completed by totalizing charging current (current needed for charging the storage battery) to calculate the integration value of the charging current have been developed (see Patent Document 2).

REFERENCE

[Patent Document 1] Japanese Published Patent Application No. 2006-269426
[Patent Document 2] Japanese Published Patent Application No. 2004-364419

SUMMARY OF THE INVENTION

In Patent Document 2, a charging circuit 1 has a positive input terminal TM1 and a negative input terminal TM2, and a microcomputer 5 incorporating an analog-digital converter (also referred to as A/D converter or ADC) which converts an input analog signal into a digital signal. This is because a storage battery 2 and the like operate with analog signals, whereas the microcomputer and an external circuit of the charging circuit 1 operate with digital signals.

However, the analog-digital converter in the charging device has a problem of increasing power consumption of the charging device because of a large amount of power consumption of the analog-digital converter.

In view of the above, an object of one embodiment of the disclosed invention is to provide a low-power-consumption charging device.

The description of the above object does not disturb the existence of other objects. Note that one embodiment of the present invention does not necessarily solve the above object. Objects other than the above object will be apparent from and can be derived from the description of the specification, the drawings, the claims, and the like.

One embodiment of the disclosed invention is a charging device which is used for charging a storage battery and includes a circuit that generates a current which depends on the charging current of the storage battery; a circuit that accumulates charge when the current depending on the charging current is supplied; and a circuit that outputs a signal indicating completion of charge of the storage battery when the potential of the circuit where the charge is accumulated reaches a reference potential.

The charging current (referred to as Ic) of the storage battery is an analog signal which changes in an analog manner and flows through a resistive element having a known resistance value. A voltage-to-current converter circuit electrically connected to both terminals of the resistive element determines a potential difference between the terminals of the resistive element.

The voltage-to-current converter circuit supplies a current (referred to as Is) which depends on the potential difference between the terminals of the resistive element. Thus, the current Is is a current depending on the charging current Ic or part of the charging current Ic. The voltage-to-current converter circuit can be said to be a circuit which generates the current Is, which depends on the charging current Ic, or a circuit which generates the current Is, which is part of the charging current Ic, from the charging current Ic.

An output of the voltage-to-current converter circuit is electrically connected to one of a source and a drain of a transistor where an oxide semiconductor is used for a channel formation region (hereinafter referred to as an "oxide semiconductor transistor") and which serves as a switching element. A pulse signal is input to a gate of the oxide semiconductor transistor and switching between an on state and an off state is performed in response to the pulse signal.

The other of the source and the drain of the transistor is electrically connected to a capacitor. When the transistor is on, the current Is flows between the source and the drain of the transistor and thus charge is accumulated in the capacitor.

One terminal of the capacitor and the other of the source and the drain of the transistor are electrically connected to a first terminal of a comparator. The output potential of the comparator changes from a low-level potential VL to a high-level potential VH when the potential of the one terminal of the capacitor where charge is accumulated reaches the reference potential supplied to a second terminal of the comparator.

The reference potential is set to a potential at which charge of the storage battery is completed, whereby charge can be completed when the potential of the one terminal of the capacitor reaches the reference potential. Thus, it can be said that the output potential of the comparator is a signal indicating completion of charge of the storage battery and the comparator is a circuit which outputs the signal indicating completion of charge of the storage battery.

The oxide semiconductor transistor has an advantage of a significantly low off-state leakage current per micrometer in channel width of, for example, 10 aA ($1\times10^{-17}$ A) or lower, preferably 1 aA ($1\times10^{-18}$ A) or lower, more preferably 10 zA ($1\times10^{-20}$ A) or lower, still more preferably 1 zA ($1\times10^{-21}$ A) or lower, much more preferably 100 yA ($1\times10^{-22}$ A) or lower. For this reason, the use of the oxide semiconductor transistor as the transistor electrically connected to the capacitor allows prevention of leakage of charge accumulated in the capacitor through the source and the drain of the transistor which is off. Thus, the amount of charge accumulated in the capacitor can be maintained and the charge amounts in the capacitor are totalized periodically, so that the potential of the capacitor and the reference potential indicating completion of charge can be compared.

Thus, a charging device which does not include any analog-digital converter and thus which has a low power consumption can be manufactured.

One embodiment of the disclosed invention is a charging device which is used for charging a storage battery and includes a circuit that generates a current which depends on a charging current supplied from a power supply control circuit; a circuit that accumulates charge which depends on a charging current as an analog signal in a capacitor when the current depending on the charging current is supplied; and a circuit that outputs a signal indicating completion of charge of the storage battery to a control circuit of the power supply control circuit when the potential of the capacitor where the charge is accumulated reaches a reference potential. When the signal indicating completion of charge of the storage battery is output to the control circuit of the power supply control circuit, the supply of the charging current is terminated.

One embodiment of the disclosed invention is a charging device used for charging a storage battery and includes a circuit that generates a current which depends on a charging current supplied from a power supply control circuit; a switching element that is turned on or off in response to an input pulse signal; a capacitor that is electrically connected to the switching element and in which charge depending on a charging current is accumulated when a current depending on the charging current is supplied through the switching element which is on; and a circuit that outputs a signal indicating completion of charge of the storage battery to a control circuit of the power supply control circuit when the potential of the capacitor where the charge is accumulated reaches a reference potential. When the signal indicating completion of charge of the storage battery is output to the control circuit of the power supply control circuit, the supply of the charging current is terminated.

One embodiment of the disclosed invention is a charging device used for charging a storage battery and includes a circuit that generates a current which depends on a charging current supplied from a power supply control circuit; a transistor in which an oxide semiconductor is used for a channel formation region and which is turned on or off in response to a pulse signal input to a gate; a capacitor that is electrically connected to the transistor and in which charge depending on a charging current is accumulated when a current depending on the charging current is supplied through the transistor which is on; and a circuit that outputs a signal indicating completion of charge of the storage battery to a control circuit of the power supply control circuit when the potential of the capacitor where the charge is accumulated reaches a reference potential. When the signal indicating completion of charge of the storage battery is output to the control circuit of the power supply control circuit, the supply of the charging current is terminated.

One embodiment of the disclosed invention is a charging device used for charging a storage battery and includes a resistive element where a charging current of the storage battery flows; an operational amplifier that generates a current which depends on a charging current in accordance with a voltage applied to the resistive element; a transistor in which an oxide semiconductor is used for a channel formation region and which is turned on or off in response to a pulse signal input to a gate; a capacitor that is electrically connected to the transistor and in which charge is accumulated when part of a charging current is supplied through the transistor which is on; and a comparator that includes a first input terminal to which the potential of the capacitor where the charge is accumulated is supplied and a second input terminal to which a reference potential is supplied. The potential of the capacitor and the reference potential are compared, so that the output potential of the comparator is switched. When the output potential is switched, the supply of the charging current is terminated.

In one embodiment of the disclosed invention, the comparator may be a hysteresis comparator.

In one embodiment of the disclosed invention, the oxide semiconductor may be any of the following: an indium oxide, an In—Zn-based oxide, an In—Mg-based oxide, an In—Ga-based oxide, an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

According to one embodiment of the disclosed invention, a low-power-consumption charging device can be manufactured.

DETAILED DESCRIPTION OF THE INVENTION

Figure 1:
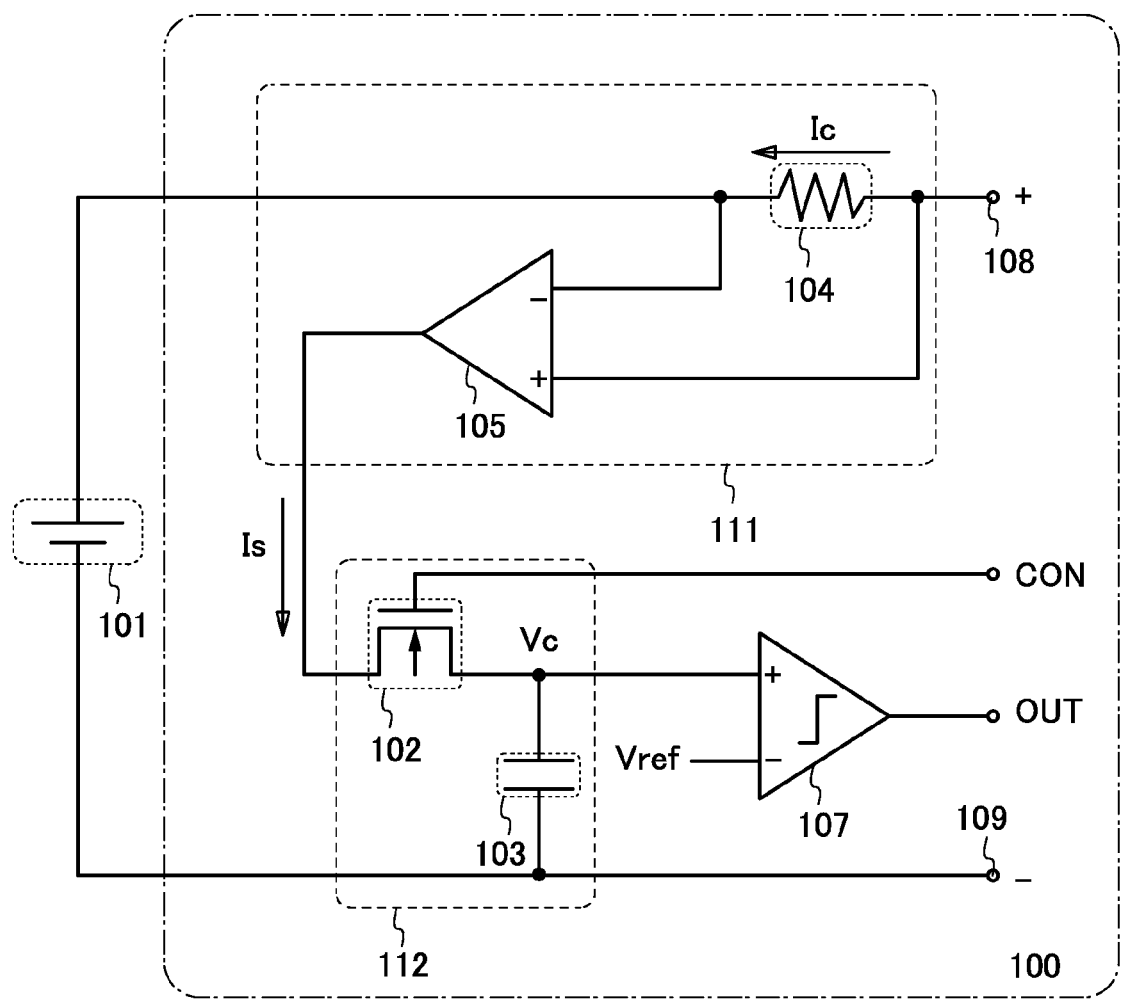
FIG. 1 is a circuit diagram of a charging circuit.

Embodiments of the invention disclosed in this specification will be hereinafter described with reference to the accompanying drawings. Note that the invention disclosed in this specification can be carried out in a variety of different modes, and it is easily understood by those skilled in the art that the modes and the details of the invention disclosed in this specification can be changed in various ways without departing from the spirit and the scope thereof. Therefore, the present invention is not construed as being limited to description of the embodiments. Note that, in the drawings hereinafter shown, the same portions or portions having similar functions are denoted by common reference numerals, and repeated description thereof will be omitted. Further, in some cases, the same hatching patterns are applied to similar parts, and the similar parts are not necessarily designated by reference numerals.

Note that in the invention disclosed in this specification, a semiconductor device refers to an element or a device which functions by utilizing a semiconductor and includes, in its category, an electric apparatus including an electronic circuit, a display device, a light-emitting device, a memory device, and the like and an electric device on which the electric apparatus is mounted.

Note that the position, the size, the range, or the like of each component illustrated in the drawings and the like is not accurately represented in some cases for the sake of simplicity. Therefore, the disclosed invention is not necessarily limited to the position, the size, the range, or the like disclosed in the drawings and the like.

In this specification, ordinal numbers such as "first", "second", and "third" are used in order to avoid confusion among components, and the terms do not mean limitation of the number of components.

In addition, in this specification, the term such as "electrode" or "line" does not limit a function of a component. For example, an "electrode" is sometimes used as part of a "line", and vice versa. Furthermore, the term "electrode" or "line" can include the case where a plurality of "electrodes" or "lines" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification, the term "electrically connected" includes the case where components are connected through an object having any electric function. There is no particular limitation on an object having any electric function as long as electric signals can be transmitted and received between components that are connected through the object. Examples of an object having any electric function are a switching element such as a transistor, a resistor, an inductor, a capacitor, and an element with a variety of functions as well as an electrode and a line.

In this specification, the terms "over" and "below" do not necessarily mean "directly on" and "directly under", respectively, in the description of a positional relation between components. For example, the expression "a gate electrode over a gate insulating film" can mean the case where there is an additional component between the gate insulating film and the gate electrode.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

Embodiment 1

Circuit Configuration of Charging Circuit

FIG. 1 is a circuit diagram of a charging circuit of this embodiment. The charging circuit 100 in FIG. 1 includes a transistor 102, a capacitor 103, a resistive element 104, a voltage-to-current converter circuit 105, and a hysteresis comparator (also referred to as a schmitt trigger) 107. A terminal 108, a terminal 109, a terminal CON, and a terminal OUT of the charging circuit 100 are electrically connected to an external circuit. Further, a storage battery 101 which is charged by the charging circuit 100 in FIG. 1 is electrically connected to the charging circuit 100.

Note that the transistor 102 and the capacitor 103 are included in an integration circuit 112. The transistor 102 is turned on or off in response to a pulse signal input to a gate, which will be described in detail later. When the transistor 102 is on, current flows between a source and a drain of the transistor 102 and charge is accumulated in the capacitor 103.

The resistive element 104 and the voltage-to-current converter circuit 105 are included in a current determination circuit 111. In the charging circuit 100 in FIG. 1, the current determination circuit 111 is provided on the positive potential side.

The terminal 108 is a terminal to which a positive potential is supplied in charging and is electrically connected to one terminal of the resistive element 104 and a non-inverting input terminal of the voltage-to-current converter circuit 105.

The resistive element 104 is a resistor used for determining the value of a charging current Ic and has a known resistance value R. The one terminal of the resistive element 104 is electrically connected to the terminal 108 and the non-inverting input terminal of the voltage-to-current converter circuit 105. The other terminal of the resistive element 104 is electrically connected to an inverting input terminal of the voltage-to-current converter circuit 105 and a positive electrode of the storage battery 101.

The voltage-to-current converter circuit 105 is a circuit which supplies a current Is in accordance with a potential difference between the one terminal and the other terminal of the resistive element 104 (a voltage applied to the resistive element 104) and is, for example, an operational amplifier. Specifically, the voltage-to-current converter circuit 105 supplies a current Is which is proportional to a potential difference between the one terminal and the other terminal of the resistive element 104 (a difference between potentials supplied to the non-inverting input terminal and the inverting input terminal of the voltage-to-current converter circuit 105). Since the resistance value R of the resistive element 104 is known, the potential difference between the one terminal and the other terminal of the resistive element 104 is proportional to the charging current Ic. Thus, the current Is depends on the charging current Ic and can be said to be part of the charging current Ic. The voltage-to-current converter circuit 105 can be said to be a circuit which generates the current Is, which is part of the charging current Ic, from the charging current Ic.

The non-inverting input terminal of the voltage-to-current converter circuit 105 is electrically connected to the one terminal of the resistive element 104 and the terminal 108. The inverting input terminal of the voltage-to-current converter circuit 105 is electrically connected to the other terminal of the resistive element 104 and the positive electrode of the storage battery 101. An output terminal of the voltage-to-current converter circuit 105 is electrically connected to one of the source and the drain of the transistor 102.

Although a lithium secondary battery may be used as the storage battery 101, for example, the storage battery 101 is not limited to this and may be any other storage battery.

In the case of using a lithium secondary battery whose charge curve (a curve obtained by plotting capacity with respect to charging voltage or a curve obtained by plotting time with respect to charging voltage) has a plateau as the storage battery 101, even an increase in charge capacity does not change a charging voltage in the plateau region in a charging device which determines the changing voltage of the lithium secondary battery and controls charging. For this reason, it is difficult for the charging device to accurately determine charge capacity.

However, the charging circuit 100 of this embodiment determines charge stored in the storage battery 101 based on the product of the charging current Ic (practically, the current Is, which is part of the charging current Ic) and charging time. Thus, even in the case of using a lithium secondary battery whose charge curve has a plateau as the storage battery 101, accurate determination of the amount stored charge (charge capacity) is possible.

The positive electrode of the storage battery 101 is electrically connected to the other terminal of the resistive element 104 and the inverting input terminal of the voltage-to-current converter circuit 105. A negative electrode of the storage battery 101 is electrically connected to the other terminal of the capacitor 103 and the terminal 109.

The transistor 102 is a switching element which is turned on or off in accordance with a potential CON supplied from the terminal CON. The potential CON (also referred to as a signal CON) is a pulse signal and is a high-level potential VH or a low-level potential VL, which will be described in detail later. When the transistor 102 is on (when the potential CON is the high-level potential VH), the current Is flows between the source and the drain and charge depending on the current Is is accumulated in the capacitor 103.

In this embodiment, the high-level potential VH is higher than the low-level potential VL and a low-level power supply potential VSS and lower than or equal to a high-level power supply potential VDD. Further, the low-level potential VL is lower than the high-level potential VH, higher than or equal to the low-level power supply potential VSS, and lower than the high-level power supply potential VDD. Note that the low-level power supply potential VSS may be a ground potential GND; however, it can be any potential lower than the high-level power supply potential VDD. The above can be expressed by the following formula: high-level power supply potential VDD≥high-level potential VH>low-level potential VL≥low-level power supply potential VSS (note that the low-level power supply potential VSS may be the ground potential GND).

An oxide semiconductor is preferably used for a channel formation region of the transistor 102, in which case an advantage of an extremely low leakage current in an off state (an extremely low off-state current) can be obtained. In this specification, a transistor where an oxide semiconductor is used for a channel formation region is referred to as an oxide semiconductor transistor. The use of an oxide semiconductor transistor as the transistor 102 enables prevention of leakage of stored charge in the capacitor 103 through the source and the drain of the transistor 102 when the transistor 102 is off.

In this embodiment, as the transistor 102 serving as a switching element which is turned on or off in accordance with the potential CON supplied from the terminal CON as described above, an oxide semiconductor transistor where the off-state current is further lower is used. However, any other switching element may be used as the transistor 102 as long as charge stored in the capacitor 103 does not leak.

The gate of the transistor 102 is electrically connected to the terminal CON. One of the source and the drain of the transistor 102 is electrically connected to the output terminal of the voltage-to-current converter circuit 105. The other of the source and the drain of the transistor 102 is electrically connected to one terminal of the capacitor 103 and a non-inverting input terminal of the hysteresis comparator 107.

The capacitor 103 is an element which accumulates the charge of the current Is flowing between the source and the drain of the transistor 102. Accumulation of the charge in the capacitor 103 increases a potential Vc of the one terminal of the capacitor 103.

The one terminal of the capacitor 103 is electrically connected to the other of the source and the drain of the transistor 102 and the non-inverting input terminal of the hysteresis comparator 107. The other terminal of the capacitor 103 is electrically connected to the negative electrode of the storage battery 101 and the terminal 109.

The hysteresis comparator 107 is a comparator with hysteresis between an input and an output. In other words, a potential at which output is changed when a difference between a potential supplied to the non-inverting input terminal and a potential supplied to an inverting input terminal is increased is different from a potential at which output is changed when a difference between a potential supplied to the non-inverting input terminal and a potential supplied to the inverting input terminal is decreased. The use of the hysteresis comparator allows prevention of frequent switching of an output potential due to an influence of noise.

Although the hysteresis comparator is used to prevent frequent switching of an output potential due to an influence of noise in this embodiment, the hysteresis comparator is not necessarily used. Any other comparator may be used instead of the hysteresis comparator as long as an output potential can be changed by a difference between a potential supplied to the non-inverting input terminal and a potential supplied to the inverting input terminal.

A reference potential Vref is supplied to the inverting input terminal of the hysteresis comparator 107. The non-inverting input terminal of the hysteresis comparator 107 is electrically connected to the other of the source and the drain of the transistor 102 and the one terminal of the capacitor 103. Since the non-inverting input terminal of the hysteresis comparator 107 is electrically connected to the one terminal of the capacitor 103, the potential Vc is supplied to the non-inverting input terminal of the hysteresis comparator 107. The output terminal of the hysteresis comparator 107 is electrically connected to the terminal OUT.

When the reference potential Vref supplied to the inverting input terminal of the hysteresis comparator 107 is higher than the potential Vc supplied to the non-inverting input terminal, the hysteresis comparator 107 supplies the low-level potential VL from the output terminal to the terminal OUT. When the potential Vc supplied to the non-inverting input terminal of the hysteresis comparator 107 is higher than or equal to the reference potential Vref supplied to the inverting input terminal of the hysteresis comparator 107, the hysteresis comparator 107 supplies the high-level potential VH from the output terminal to the terminal OUT. The potential Vc reaches the reference potential Vref, the potential of the terminal OUT (referred to as a potential OUT) changes from the low-level potential VL to the high-level potential VH.

The reference potential Vref is set to a potential at which charge of the storage battery 101 is completed, whereby charge can be completed when the potential Vc reaches the reference potential Vref. Thus, it can be said that the output potential of the hysteresis comparator 107 (equal to the potential OUT) is a signal indicating completion of charge of the storage battery 101 and the hysteresis comparator 107 is a circuit which outputs the signal indicating completion of charge of the storage battery 101.

The terminal 109 is a terminal to which a negative potential is supplied in charging and is electrically connected to the negative electrode of the storage battery 101 and the other terminal of the capacitor 103.

As described above, the charging circuit 100 of this embodiment determines the amount of stored charge in the storage battery 101 based on the charging current Ic serving as an analog signal. Accordingly, the amount of stored charge (charge capacity) in the storage battery can be determined without using an analog-digital converter.

<Another Configuration of Charging Circuit>

Figure 3:
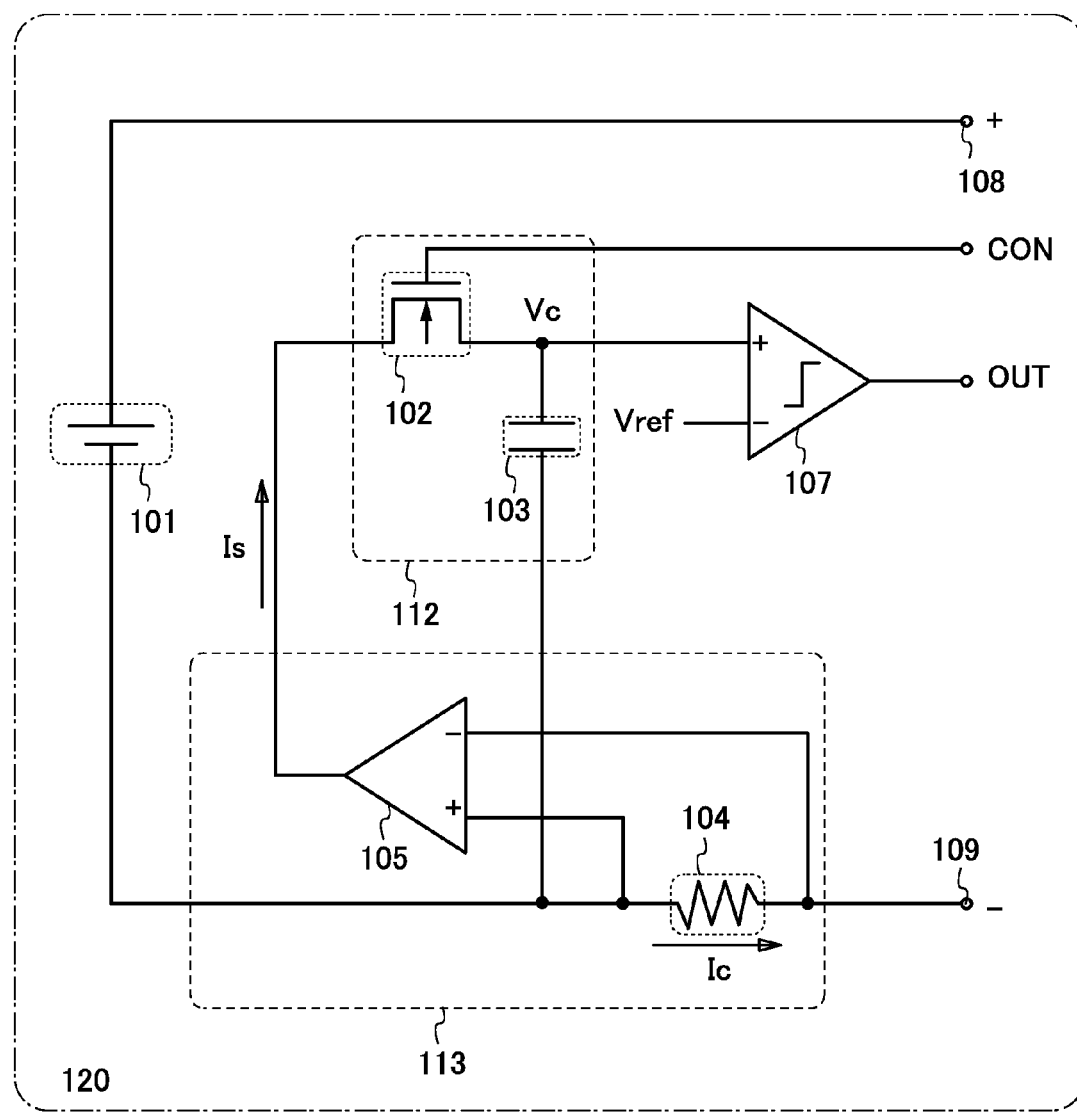
FIG. 3 is a circuit diagram of a charging circuit.

Although being provided on the positive potential side in the charging circuit 100 in FIG. 1, the current determination circuit 111 may be provided on the negative potential side. FIG. 3 illustrates an example where a current determination circuit is provided on the negative potential side. Note that, in FIG. 3, portions which are the same as those in FIG. 1 are denoted by common reference numerals. In the charging circuit 120 in FIG. 3, a current determination circuit 113 is provided on the negative potential side.

<Operation of Charging Circuit>

Figure 2:
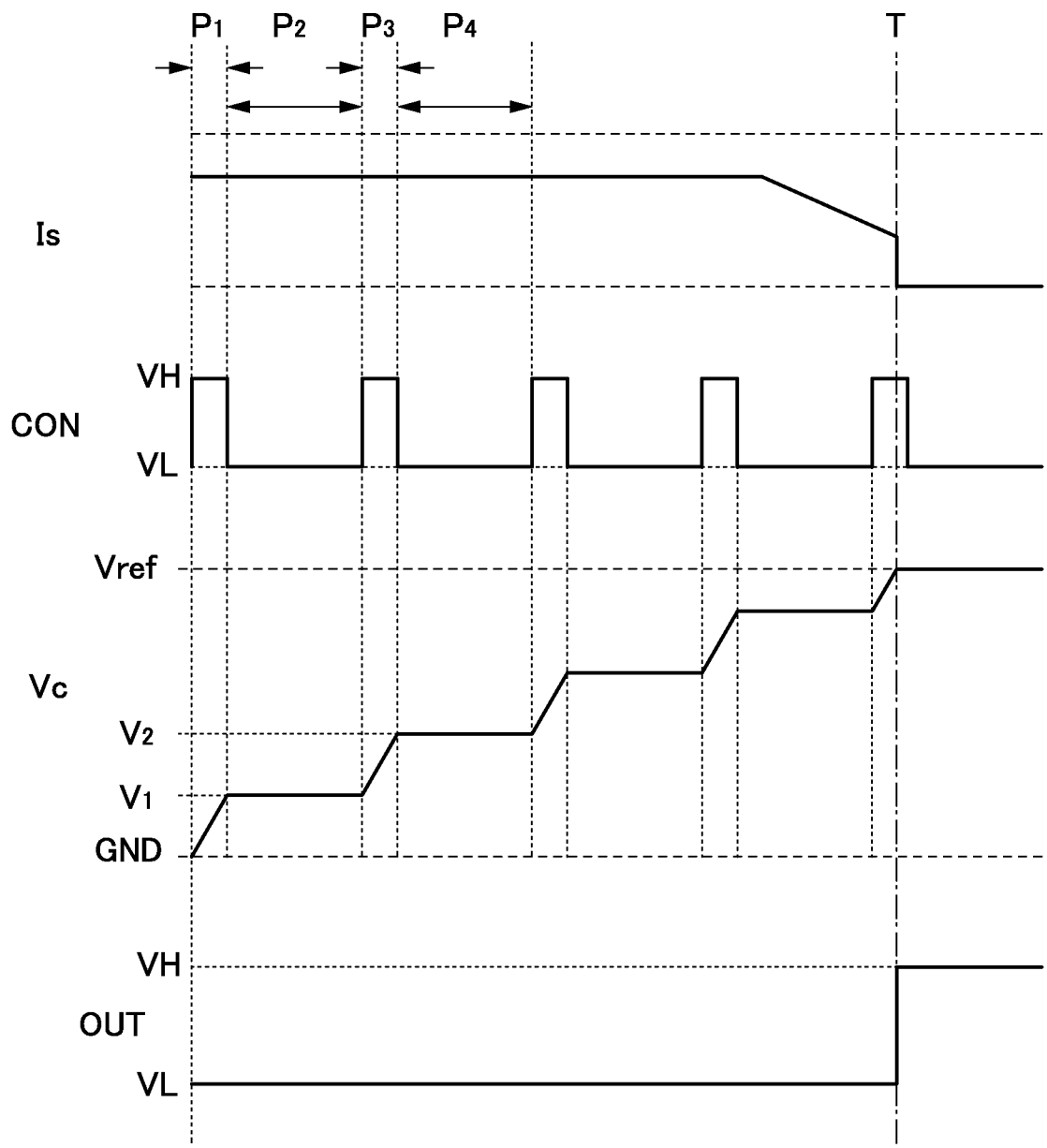
FIG. 2 is a timing chart showing operation of a charging circuit.

The details of operation of the charging circuit 100 will be described below with reference to FIGS. 1 and 2.

In a prestage, both the terminals of the capacitor 103 are supplied with the ground potential GND, charge in the capacitor 103 is discharged, and the potential Vc is set to the ground potential GND.

The potential CON serving as a pulse signal is supplied from the terminal CON to the gate of the transistor 102. The potential CON is the high-level potential VH in a period $P_{2n-1}$ (n is a natural number) and is the low-level potential VL in a period $P_{2n}$. The high-level potential VH and the low-level potential VL are alternately supplied at regular intervals (the period $P_{2n-1}$+the period $P_{2n}$). Thus, the transistor 102 is on in the period $P_{2n-1}$ and is off in the period $P_{2n}$ and alternately turned on and off repeatedly at regular intervals (the period $P_{2n-1}$+the period $P_{2n}$).

When the transistor 102 is turned on in a period $P_1$, the current Is, which is part of the charging current Ic, flows between the source and the drain of the transistor 102 and charge is accumulated in the capacitor 103, so that the potential Vc which is the potential of the one terminal of the capacitor 103 is raised from the ground potential GND to the potential V1.

When the transistor 102 is turned off in a period $P_2$, charge accumulated in the capacitor 103 is held and the potential Vc which is the potential of the one terminal of the capacitor 103 is kept at the potential V1. Since the off-state current of an oxide semiconductor transistor is extremely low, the use of an oxide semiconductor transistor as the transistor 102 allows prevention of leakage of the charge accumulated in the capacitor 103 through the source and the drain of the transistor 102.

In a period $P_3$, the potential CON is the high-level potential VH as in the period $P_1$. Thus, the transistor 102 is on, the current Is flows between the source and the drain of the transistor 102, and charge is accumulated in the capacitor 103, so that the potential Vc which is the potential of the one terminal of the capacitor 103 is raised from the potential V1 to a potential V2.

In a period $P_4$, the potential CON is the low-level potential VL as in the period $P_2$. Thus, the transistor 102 is off, charge accumulated in the capacitor 103 is held, and the potential Vc which is the potential of the one terminal of the capacitor 103 is kept at the potential V2.

The period $P_{2n-1}$ and the period $P_{2n}$ are thus repeated, whereby the potential Vc is raised. When the potential Vc is lower than the reference potential Vref, the potential OUT, which is equal to the output potential of the hysteresis comparator 107, is the low-level potential VL. When the potential Vc is raised to be higher than or equal to the reference potential Vref, the potential OUT, which is equal to the output potential of the hysteresis comparator 107, changes from the low-level potential VL to the high-level potential VH.

The reference potential Vref is set to a potential at which charge of the storage battery 101 is completed in the above manner. In this case, time T when the output potential OUT of the hysteresis comparator 107 changes from the low-level potential VL to the high-level potential VH is charge completion time.

<Configuration of Charging Device>

Next, the configuration of a charging device including the charging circuit described above will be described below.

Figure 4:
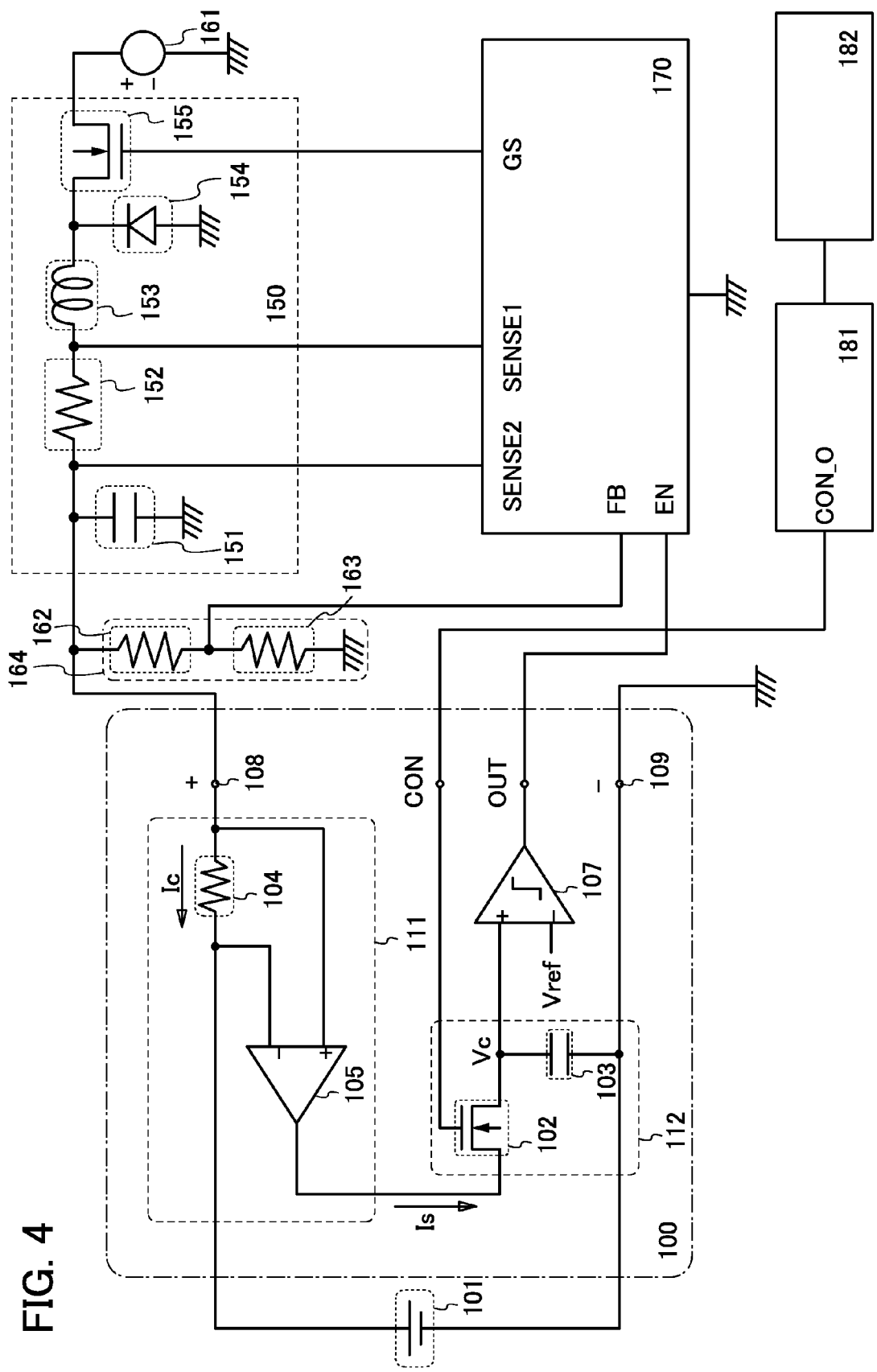
FIG. 4 is a circuit diagram of a charging device.

A charging device in FIG. 4 includes a charging circuit 100, a power supply control circuit 150, a voltage dividing circuit 164, a DC power source 161, a control circuit 170, a counter circuit 181, and an oscillator circuit 182. Although the charging circuit 100 in FIG. 1 is used in the charging device in FIG. 4, the charging circuit 120 in FIG. 3 may be used instead of the charging circuit 100.

The power supply control circuit 150 includes a capacitor 151, a resistive element 152, a coil 153, a diode 154, and a transistor 155 and is a current control circuit utilizing a step-down DC-DC converter.

One terminal of the capacitor 151 is electrically connected to one terminal of the resistive element 152, one terminal of a resistive element 162, a terminal SENSE2 of the control circuit 170, and the terminal 108 of the charging circuit 100. The other terminal of the capacitor 151 is grounded.

The one terminal of the resistive element 152 is electrically connected to the one terminal of the capacitor 151, the one terminal of a resistive element 162, the terminal SENSE2 of the control circuit 170, and the terminal 108 of the charging circuit 100. The other terminal of the resistive element 152 is electrically connected to one terminal of the coil 153 and a terminal SENSE1 of the control circuit 170. A difference between potentials supplied to the terminals of the resistive element 152 with a known resistance value is equal to a difference between potentials supplied to the terminal SENSE1 and the terminal SENSE2 of the control circuit 170. Thus, the value of a current flowing through the resistive element 152 can be measured.

The one terminal of the coil 153 is electrically connected to the other terminal of the resistive element 152 and the terminal SENSE1 of the control circuit 170. The other terminal of the coil 153 is electrically connected to a cathode of the diode 154 and one of a source and a drain of the transistor 155.

An anode of the diode 154 is grounded. The cathode of the diode 154 is electrically connected to the other terminal of the coil 153 and the one of the source and the drain of the transistor 155.

The transistor 155 is an n-channel transistor whose gate is electrically connected to a terminal GS of the control circuit 170. A pulse width modulation (PWM) signal is input to the gate of the transistor 155 from the control circuit 170, whereby the value of current flowing to the resistive element 152 can be controlled. To control the value of current flowing to the resistive element 152 is to control the value of charging current Ic supplied to the storage battery 101.

The one of the source and the drain of the transistor 155 is electrically connected to the cathode of the diode 154 and the other terminal of the coil 153. The other of the source and the drain of the transistor 155 is electrically connected to the DC power source 161.

The DC power source 161 supplies power for charging the storage battery 101. Although the DC power source 161 is used as a power supply source for charging the storage battery 101 in FIG. 4, it is not necessarily used. Instead of the DC power source 161, an AC power source (e.g., a commercial power supply) and an AC-DC converter (also referred to as AC-DC inverter) for converting AC power of an AC power source into DC power may be used.

The one terminal of the resistive element 162 in the voltage dividing circuit 164 is electrically connected to the one terminal of the capacitor 151, the one terminal of the resistive element 152, the terminal SENSE2 of the control circuit 170, and the terminal 108 of the charging circuit 100. The other terminal of the resistive element 162 is electrically connected to one terminal of a resistive element 163 and a terminal FB of the control circuit 170.

The one terminal of the resistive element 163 is electrically connected to the other terminal of the resistive element 162 and the terminal FB of the control circuit 170. The other terminal of the resistive element 163 is grounded.

The voltage dividing circuit 164 can determine the value of a potential supplied to the one terminal of the resistive element 162, i.e., the value of a potential supplied to the terminal 108 of the charging circuit 100 with the use of the resistive element 162 and the resistive element 163 with known resistance values. Specifically, a potential supplied to the other terminal of the resistive element 162 and the one terminal of the resistive element 163, which is a potential obtained by dividing a potential supplied to the one terminal of the resistive element 162, is supplied to the control circuit 170 through the terminal FB. As described above, the resistance values of the resistive element 162 and the resistive element 163 are known; therefore, the value of a potential supplied to the one terminal of the resistive element 162 (the value of a potential supplied to the terminal 108 of the charging circuit 100) can be determined based on a potential supplied to the terminal FB.

A counter circuit 181 is a circuit that generates the potential CON which is input to the gate of the transistor 102 in the charging circuit 100 and which serves as a pulse signal. One terminal of the counter circuit 181 is electrically connected to the gate of the transistor 102 through the terminal CON. The other terminal of the counter circuit 181 is electrically connected to the oscillator circuit 182.

The oscillator circuit 182 is a circuit which transmits a reference pulse signal used when the counter circuit 181 generates the potential CON serving as a pulse signal. The oscillator circuit 182 is electrically connected to the other terminal of the counter circuit 181.

The control circuit 170 measures the value of a current flowing between the terminal SENSE1 and the terminal SENSE2, i.e., the value of a current flowing to the resistive element 152 by determining the potentials of the terminal SENSE1 and the terminal SENSE2. The control circuit 170 generates a pulse width modulation signal and inputs the pulse width modulation signal from the terminal GS to the gate of the transistor 155, thereby controlling the value of a current flowing to the resistive element 152, i.e., the value of the charging current Ic to the storage battery 101.

The control circuit 170 controls a pulse width modulation signal input to the gate of the transistor 155 based on a potential supplied to the terminal FB. As described above, to control a pulse width modulation signal is to control the value of current flowing to the resistive element 152, and is also to control the value of charging current Ic supplied to the storage battery 101.

The output potential of the hysteresis comparator 107 is supplied to the terminal EN of the control circuit 170 through the terminal OUT of the charging circuit 100. When the potential OUT, which is the output potential of the hysteresis comparator 107, changes from the low-level potential VL to the high-level potential VH, the input of a pulse width modulation signal from the terminal GS to the gate of the transistor 155 is stopped. In this manner, the supply of the charging current to the storage battery 101 is terminated, so that charge of the storage battery 101 can be completed.

<Another Configuration 1 of Charging Device>

Figure 5:
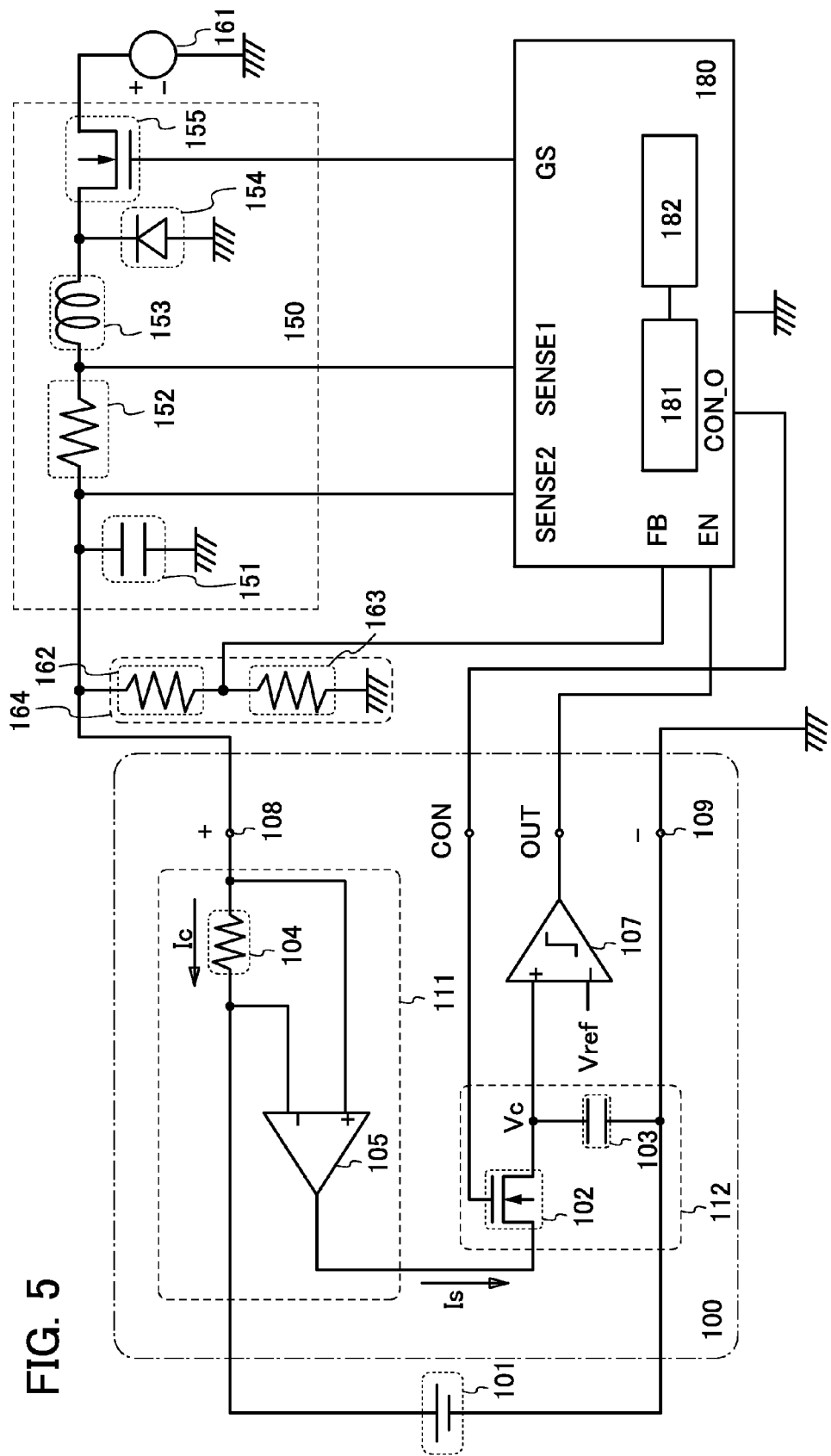
FIG. 5 is a circuit diagram of a charging device.

FIG. 5 is an example of a charging device with a configuration different from that in FIG. 4. In the charging device in FIG. 5, the control circuit 180 includes the counter circuit 181 and the oscillator circuit 182. A terminal CON_O of the control circuit 180 is electrically connected to the gate of the transistor 102 through the terminal CON of the charging circuit 100, and the potential CON serving as a pulse signal is supplied from the terminal CON_O of the control circuit 180 to the gate of the transistor 102.

<Another Configuration 2 of Charging Device>

Figure 6:
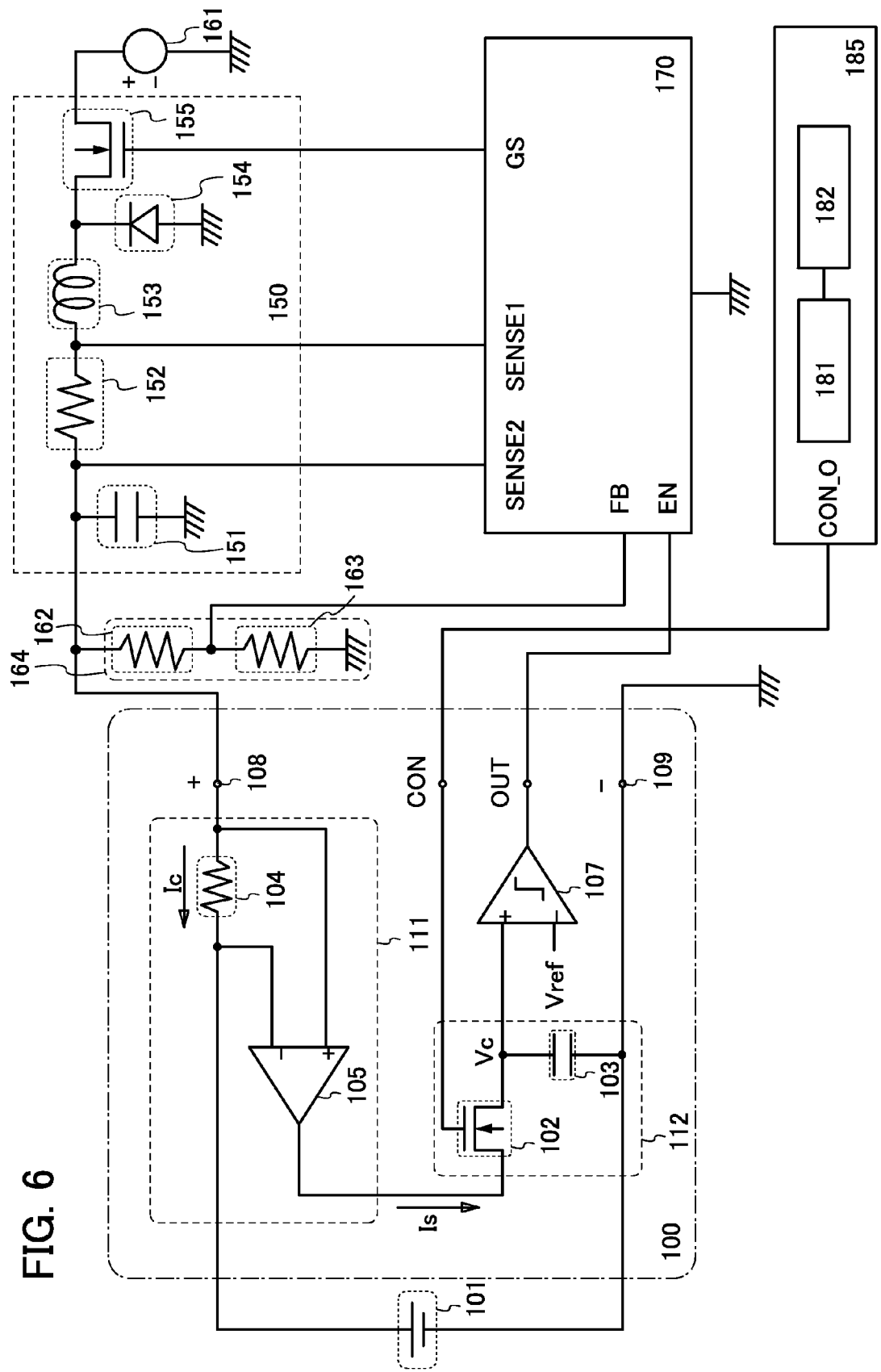
FIG. 6 is a circuit diagram of a charging device.

FIG. 6 is an example of a charging device with a configuration different from those in FIGS. 4 and 5. In the charging device in FIG. 6, a microcomputer 185 includes the counter circuit 181 and the oscillator circuit 182. The terminal CON_O of the microcomputer 185 is electrically connected to the gate of the transistor 102 through the terminal CON of the charging circuit 100, and the potential CON serving as a pulse signal is supplied from the terminal CON_O of the microcomputer 185 to the gate of the transistor 102.

Note that an oxide semiconductor transistor which will be described in Embodiment 3 may be used as a transistor included in the microcomputer 185.

<Another Configuration 3 of Charging Device>

Figure 7:
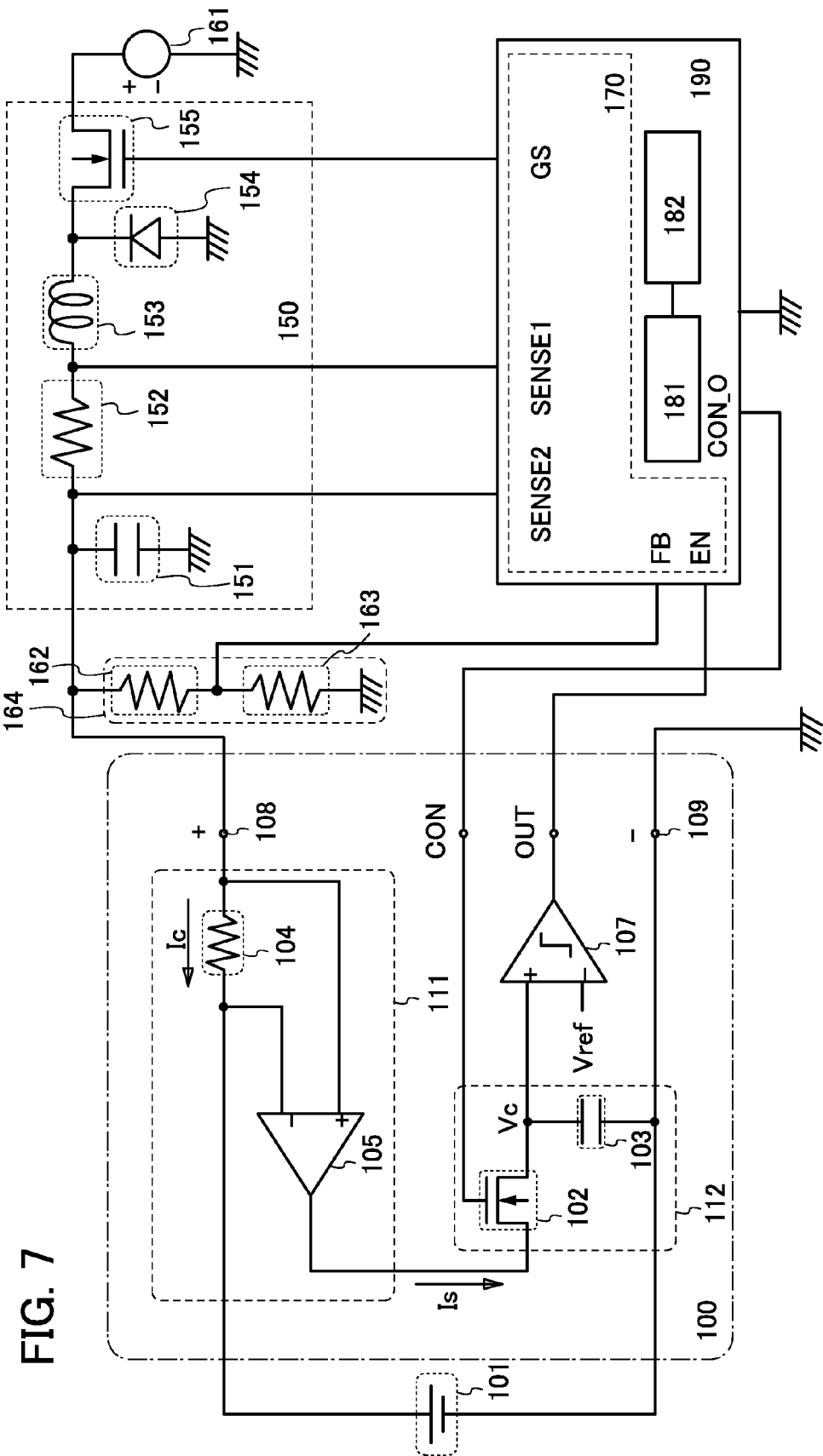
FIG. 7 is a circuit diagram of a charging device.

FIG. 7 is an example of a charging device with a configuration different from those in FIGS. 4 to 6. In the charging device in FIG. 7, a microcomputer 190 includes the control circuit 170, the counter circuit 181, and the oscillator circuit 182. The microcomputer 190 is provided with the terminal GS, the terminal SENSE1, the terminal SENSE2, the terminal FB, and the terminal EN of the control circuit 170 and the terminal CON_O of the counter circuit 181.

Note that an oxide semiconductor transistor which will be described in Embodiment 3 may be used as a transistor included in the microcomputer 190.

According to this embodiment, a charging device without an analog-digital converter can be formed.

Further, in this embodiment, a charging device which does not include any analog-digital converter and thus which has a low power consumption can be formed.

Embodiment 2

In this embodiment, a lithium secondary battery will be described as an example of the storage battery 101 described in Embodiment 1.

Figure 8A:
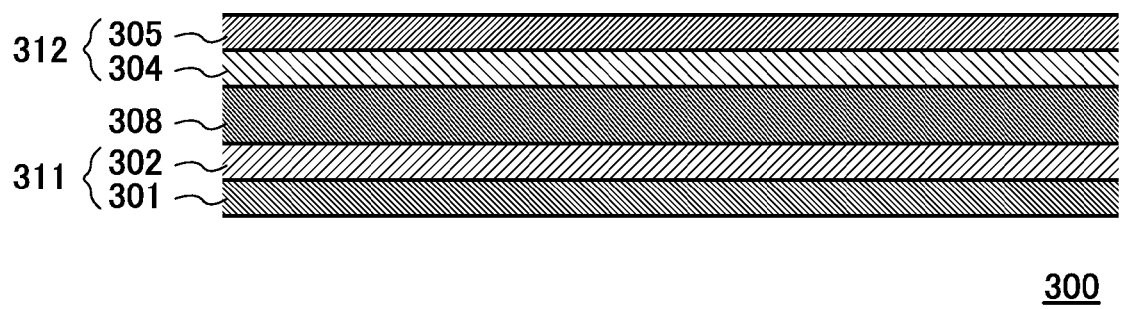
FIGS. 8A and 8B each illustrate a storage battery.

FIG. 8A is a cross-sectional view of a storage battery. A storage battery 300 in FIG. 8A includes a positive electrode 311, a negative electrode 312, and an electrolytic solution 308. The positive electrode 311 includes a positive electrode current collector 301 and a positive electrode active material layer 302. The negative electrode 312 includes a negative electrode current collector 305 and a negative electrode active material layer 304. The electrolytic solution 308 is a liquid electrolyte provided between the positive electrode 311 and the negative electrode 312.

The positive electrode 311 is formed in such a manner that the positive electrode active material layer 302 is formed over the positive electrode current collector 301 by a CVD method, a sputtering method, or a coating method.

The positive electrode current collector 301 can be formed using a highly-conductive material which is not alloyed with a carrier ion of lithium or the like, such as a metal typified by stainless steel, gold, platinum, zinc, iron, copper, aluminum, or titanium, or an alloy thereof. Alternatively, an aluminum alloy to which an element which improves heat resistance, such as silicon, titanium, neodymium, scandium, or molybdenum, is added can be used. Still alternatively, a metal element which forms silicide by reacting with silicon can be used. Examples of the metal element which forms silicide by reacting with silicon include zirconium, titanium, hafnium, vanadium, niobium, tantalum, chromium, molybdenum, tungsten, cobalt, nickel, and the like. The positive electrode current collector 301 can have a foil-like shape, a plate-like shape (sheet-like shape), a net-like shape, a punching-metal shape, an expanded-metal shape, or the like as appropriate.

As a positive electrode material in the positive electrode active material layer 302, a material into and from which carrier ions such as lithium ions can be inserted and extracted can be used; for example, any of a variety of compounds such as $LiFeO_2$, $LiCoO_2$, $LiNiO_2$, $LiMn_2O_4$, $V_2O_5$, $Cr_2O_5$, and $MnO_2$ can be used. The positive electrode active material layer 302 may be formed by a coating method in such a manner that a conductive additive or a binder is added to a positive electrode active material to form a positive electrode paste, and the positive electrode paste is applied to the positive electrode current collector 301 and dried.

Examples of a lithium oxide with a layered rock-salt crystal structure which is used as a positive electrode active material are a lithium cobalt oxide ($LiCoO_2$), $LiNiO_2$, $LiMnO_2$, $Li_2MnO_3$, a NiCo oxide (general formula: $LiNi_xCo_{1-x}O_2$ ($0<x<1$)) such as $LiNi_{0.8}Co_{0.20}O_2$, a NiMn oxide (general formula: $LiNi_xMn_{1-x}O_2$ ($0<x<1$)) such as $LiNi_{0.5}Mn_{0.5}O_2$, a NiMnCo oxide (also referred to as NMC) (general formula: $LiNi_xMn_yCo_{1-x-y}O_2$ ($x>0, y>0, x+y<1$)) such as $LiNi_{1/3}Mn_{1/3}Co_{1/3}O_2$, $Li(Ni_{0.8}Co_{0.15}Al_{0.05})O_2$, and $Li_2MnO_3$—$LiMO_2$ (M=Co, Ni, or Mn).

$LiCoO_2$ is particularly preferable because of its advantages such as high capacity and stability in the air higher than that of $LiNiO_2$ and thermal stability higher than that of $LiNiO_2$.

Examples of a lithium oxide with a spinel crystal structure are $LiMn_2O_4$, $Li_{1+x}Mn_{2-x}O_4$, $Li(MnAl)_2O_4$, and $LiMn_{1.5}Ni_{0.5}O_4$.

It is preferable to add a small amount of lithium nickel oxide ($LiNiO_2$ or $LiNi_{1-x}MO_2$ (M=Co, Al, or the like)) to a lithium oxide with a spinel crystal structure which contains manganese such as $LiMn_2O_4$ because an advantage such as minimization of the elution of manganese can be obtained.

Alternatively, an olivine-type lithium oxide ($LiMPO_4$ (M is one or more of Fe(II), Mn(II), Co(II), and Ni(II))) can be used as a positive electrode active material. Typical examples of $LiMPO_4$ (general formula) which can be used as a material are lithium compounds such as $LiFePO_4$, $LiNiPO_4$, $LiCoPO_4$, $LiMnPO_4$, $LiFe_aNi_bPO_4$, $LiFe_aCo_bPO_4$, $LiFe_aMn_bPO_4$, $LiNi_aCo_bPO_4$, $LiNi_aMn_bPO_4$ ($a+b\le1$, $0<a<1$, and $0<b<1$), $LiFe_cNi_dCo_ePO_4$, $LiFe_cNi_dMn_ePO_4$, $LiNi_cCo_dMn_ePO_4$ ($c+d+e\le1$, $0\le c\le1$, $0<d<1$, and $0<e<1$), and $LiFe_fNi_gCo_hMn_iPO_4$ ($f+g+h+i\le1$, $0<f<1$, $0<g<1$, $0<h<1$, and $0<i<1$).

A charge curve of a lithium secondary battery containing, for example, a lithium iron phosphate ($LiFePO_4$) as a positive electrode active material has a plateau. The charging device of one embodiment of the present invention which includes a lithium secondary battery containing a lithium iron phosphate ($LiFePO_4$) as a positive electrode active material as the storage battery 101 of Embodiment 1 also determines the amount of charge stored in the storage battery 101 based on the product of the charging current Ic and the charging time, so that accurate determination of stored charge (stored capacity) is possible.

Besides, $LiFePO_4$ is preferable because it properly satisfies conditions necessary for a positive electrode active material, such as safety, stability, high capacity density, high potential, and the existence of lithium ions which can be extracted in initial oxidation (charging).

Alternatively, a lithium oxide such as $Li_{(2-j)}MSiO_4$ (general formula) (M is one or more of Fe(II), Mn(II), Co(II), and Ni(II), $0\le j\le2$) can be used as a positive electrode active material. Typical examples of $Li_{(2-j)}MSiO_4$ (general formula) are lithium compounds such as $Li_{(2-j)}FeSiO_4$, $Li_{(2-j)}NiSiO_4$, $Li_{(2-j)}CoSiO_4$, $Li_{(2-j)}MnSiO_4$, $Li_{(2-j)}Fe_kNi_lSiO_4$, $Li_{(2-j)}Fe_kCo_lSiO_4$, $Li_{(2-j)}Fe_kMn_lSiO_4$, $Li_{(2-j)}Ni_kCo_lSiO_4$, $Li_{(2-j)}Ni_kMn_lSiO_4$ ($k+l\le1$, $0<k\le1$, and $0<l<1$), $Li_{(2-j)}Fe_mNi_nCo_qSiO_4$, $Li_{(2-j)}Fe_mNi_nMn_qSiO_4$, $Li_{(2-j)}Ni_mCo_nMn_qSiO_4$ ($m+n+q\le1$, $0<m<1$, $0<n<1$, and $0<q<1$), and $Li_{(2-j)}Fe_rNi_sCo_tMn_uSiO_4$ ($r+s+t+u\le1$, $0<r<1$, $0<s<1$, $0<t<1$, and $0<u<1$).

Still alternatively, a nasicon compound expressed by $A_xM_2(XO_4)_3$ (general formula) (A=Li, Na, or Mg, M=Fe, Mn, Ti, V, Nb, or Al, X=S, P, Mo, W, As, or Si) can be used as a positive electrode active material. Examples of the nasicon compound are $Fe_2(MnO_4)_3$, $Fe_2(SO_4)_3$, and $Li_3Fe_2(PO_4)_3$. Further alternatively, a compound expressed by $Li_2MPO_4F$, $Li_2MP_2O_7$, or $Li_5MO_4$ (general formula) (M=Fe or Mn), a perovskite fluoride such as $NaF_3$ or $FeF_3$, a metal chalcogenide (a sulfide, a selenide, or a telluride) such as $TiS_2$ or $MoS_2$, a lithium oxide with an inverse spinel crystal structure such as $LiMVO_4$, a vanadium oxide ($V_2O_5$, $V_6O_{13}$, $LiV_3O_8$, or the like), a manganese oxide, an organic sulfur, or the like can be used as a positive electrode active material.

In the case where carrier ions are alkali metal ions other than lithium ions, alkaline-earth metal ions, beryllium ions, or magnesium ions, the following may be used for a positive electrode active material: an oxide obtained by substituting an alkali metal (e.g., sodium or potassium), an alkaline-earth metal (e.g., calcium, strontium, or barium), beryllium, or magnesium for lithium in the lithium compound or the lithium oxide.

Note that the active material refers to a material that relates to insertion and extraction of ions which function as carriers. When an electrode (a positive electrode, a negative electrode, or both of them) is formed, an active material layer in which an active material is mixed with a conductive additive, a binding agent, a solvent, and the like is formed over a current collector. Thus, the active material and the active material layer are distinguished. Accordingly, a positive electrode active material and the positive electrode active material layer 302 are distinguished and a negative electrode active material described later and the negative electrode active material layer 304 are distinguished.

The positive electrode active material layer 302 may further include a known conductive additive and/or a known binder. The use of graphene as a conductive additive is particularly effective because an electron conduction network with high electron conductivity can be formed.

Graphene is a carbon material having a crystal structure in which hexagonal skeletons of carbon are spread in a planar form and is one atomic plane extracted from a graphite crystal.

Note that graphene in this specification refers to single-layer graphene or multilayer graphene including two or more and hundred or less layers. Single-layer graphene refers to a one-atom-thick sheet of carbon molecules having π bonds. Graphene oxide refers to a compound formed by oxidation of such graphene. When graphene oxide is reduced to form graphene, oxygen contained in the graphene oxide is not entirely released and part of the oxygen remains in the graphene. When the graphene contains oxygen, the proportion of the oxygen is higher than or equal to 2 atomic % and lower than or equal to 20 atomic %, preferably higher than or equal to 3 atomic % and lower than or equal to 15 atomic %.

In the case where graphene is multilayer graphene including graphene obtained by reducing graphene oxide, the interlayer distance between graphenes is greater than or equal to 0.34 nm and less than or equal to 0.5 nm, preferably greater than or equal to 0.38 nm and less than or equal to 0.42 nm, more preferably greater than or equal to 0.39 nm and less than or equal to 0.41 nm. In general graphite, the interlayer distance between single-layer graphenes is 0.34 nm. Since the interlayer distance between the graphenes used for the power storage device of one embodiment of the present invention is longer than that in general graphite, carrier ions can easily transfer between the graphenes in multilayer graphene.

In the positive electrode 311 of this embodiment, graphenes overlap with each other in the positive electrode active material layer 302 and dispersed so as to be in contact with a plurality of positive electrode active material particles. In other words, a network for electron conduction is formed by the graphenes in the positive electrode active material layer 302. This maintains bonds between the plurality of positive electrode active material particles, which enables the positive electrode active material layer 302 to have high electron conductivity.

As a binder included in the positive electrode active material layer 302, polyvinylidene fluoride (PVDF) as a typical one, polyimide, polytetrafluoroethylene, polyvinyl chloride, ethylene-propylene-diene polymer, styrene-butadiene rubber, acrylonitrile-butadiene rubber, fluorine rubber, polyvinyl acetate, polymethyl methacrylate, polyethylene, nitrocellulose, or the like can be used.

The negative electrode 312 is formed in such a manner that the negative electrode active material layer 304 is formed over the negative electrode current collector 305 by a CVD method, a sputtering method, or a coating method.

For the negative electrode current collector 305, it is possible to use a highly conductive material, e.g., a metal such as aluminum, copper, nickel, or titanium, an aluminum-nickel alloy, or an aluminum-copper alloy. The negative electrode current collector 305 can have a foil shape, a plate shape (a sheet-like shape), a net shape, a punching-metal shape, an expanded-metal shape, or the like as appropriate.

There is no particular limitation on a material as a negative electrode active material included in the negative electrode active material layer 304 as long as it is a material with which metal can be dissolved/precipitated or a material into/from which metal ions can be inserted/released. As a negative electrode active material, a lithium metal, a carbon-based material, silicon, a silicon alloy, or tin can be used, for example.

The negative electrode active material layer 304 may be formed by a coating method in such a manner that a conductive additive or a binder is added to a negative electrode active material to form a negative electrode paste and the negative electrode paste is applied to the negative electrode current collector 305 and dried. The use of graphene as a conductive additive is particularly effective because an electron conduction network with high electron conductivity can be formed as described above.

In the case where the negative electrode active material layer 304 is formed using silicon as a negative electrode active material, graphene is preferably formed over a surface of the negative electrode active material layer 304. The volume of silicon is greatly changed due to reception/release of carrier ions in charge/discharge cycles; thus, adhesion between the negative electrode current collector 305 and the negative electrode active material layer 304 is decreased, leading to degradation of battery characteristics caused by charge and discharge. In view of this, graphene is preferably formed over the surface of the negative electrode active material layer 304 containing silicon because even when the volume of silicon is changed in charge/discharge cycles, the graphene formed over the surface of the negative electrode active material layer 304 minimizes a decrease in adhesion between the negative electrode current collector 305 and the negative electrode active material layer 304. As a result, degradation of battery characteristics is reduced, which is preferable.

In the case where silicon is used for a negative electrode active material, amorphous silicon, microcrystalline silicon, polycrystalline silicon, or a combination thereof can be used. In general, silicon with higher crystallinity has higher electric conductivity; therefore, it can be used for an electrode having high conductivity in a power storage device. Meanwhile, amorphous silicon can receive more carrier ions such as lithium ions than crystalline silicon; thus, discharge capacity can be increased.

As a negative electrode active material, a metal which is alloyed with carrier ions or dealloyed to cause charge-discharge reaction may be used. Examples of the metal are Mg, Ca, Al, Si, Ge, Sn, Pb, As, Sb, Bi, Ag, Au, Zn, Cd, and Hg. Such metals have higher capacity than graphite. In particular, silicon (Si) has a significantly high theoretical capacity of 4200 mAh/g. For this reason, silicon is preferably used as a negative electrode active material. Examples of the alloy-based material using such elements include SiO, $Mg_2Si$, $Mg_2Ge$, SnO, $SnO_2$, $Mg_2Sn$, $SnS_2$, $V_2Sn_3$, $FeSn_2$, $CoSn_2$, $Ni_3Sn_2$, $Cu_6Sn_5$, $Ag_3Sn$, $Ag_3Sb$, $Ni_2MnSb$, $CeSb_3$, $LaSn_3$, $La_3Co_2Sn_7$, $CoSb_3$, InSb, SbSn, and the like.

Alternatively, as a negative electrode active material, an oxide such as a titanium dioxide ($TiO_2$), a lithium titanium oxide ($Li_4Ti_5O_{12}$), a lithium-graphite intercalation compound ($Li_xC_6$), a niobium pentoxide ($Nb_2O_5$), a tungsten oxide ($WO_2$), or a molybdenum oxide ($MoO_2$) can be used.

Still alternatively, as a negative electrode active material, $Li_{3-x}M_xN$ (M=Co, Ni, or Cu) with a $Li_3N$ structure, which is a nitride containing lithium and a transition metal, can be used. For example, $Li_{2.6}Co_{0.4}N_3$ is preferable because of high charge and discharge capacity (900 mAh/g).

A nitride containing lithium and a transition metal is preferably used, in which case lithium ions are contained in a negative electrode active material and thus the negative electrode active material can be used in combination with a material for a positive electrode active material which does not contain lithium ions, such as $V_2O_5$ or $Cr_3O_8$. Note that in the case of using a material containing lithium ions as a positive electrode active material, a nitride containing lithium and a transition metal can be used as a negative electrode active material when lithium ions are extracted from the positive electrode active material in advance.

As the carbon-based material, a graphite powder, a graphite fiber, graphite, or the like can be used.

The negative electrode active material layer 304 may be predoped with lithium in such a manner that a lithium layer is formed on a surface of the negative electrode active material layer 304 by a sputtering method. Alternatively, lithium foil is provided on the surface of the negative electrode active material layer 304, whereby the negative electrode active material layer 304 can be predoped with lithium.

The electrolytic solution 308 provided between the positive electrode 311 and the negative electrode 312 contains a solute and a solvent. As the solute, a lithium salt which contains lithium ions serving as carrier ions is used. Typical examples of the solute include lithium salts such as $LiClO_4$, $LiAsF_6$, $LiBF_4$, $LiPF_6$, and $Li(C_2F_5SO_2)_2N$.

Note that when carrier ions are alkali metal ions other than lithium ions, alkaline-earth metal ions, beryllium ions, or magnesium ions, instead of lithium in the above lithium salts, an alkali metal (e.g., sodium or potassium), an alkaline-earth metal (e.g., calcium, strontium, or barium), beryllium, or magnesium may be used for a solute.

As a solvent of the electrolytic solution, a material in which carrier ions can transfer is used. As the solvent of the electrolytic solution, an aprotic organic solvent is preferably used. Typical examples of aprotic organic solvents include ethylene carbonate (EC), propylene carbonate, dimethyl carbonate, diethyl carbonate (DEC), γ-butyrolactone, acetonitrile, dimethoxyethane, tetrahydrofuran, and the like, and one or more of these materials can be used. When a gelled high-molecular material is used as the solvent of the electrolytic solution, safety against liquid leakage and the like is improved. Further, a lithium secondary battery can be thinner and more lightweight. Typical examples of gelled high-molecular materials include a silicone gel, an acrylic gel, an acrylonitrile gel, polyethylene oxide, polypropylene oxide, a fluorine-based polymer, and the like. Alternatively, the use of one or more of ionic liquids (room temperature molten salts) which are less likely to burn and volatilize as a solvent of the electrolytic solution can prevent a secondary battery from exploding or catching fire even when the secondary battery internally shorts out or the internal temperature increases due to overcharging or the like.

Instead of the electrolytic solution 308, a solid electrolyte including an inorganic material such as a sulfide-based inorganic material or an oxide-based inorganic material, or a solid electrolyte including a macromolecular material such as a polyethylene oxide (PEO)-based high-molecular material may alternatively be used. The use of a solid electrolyte enables entire solidification of a battery; therefore, there is no possibility of liquid leakage and thus the safety of the battery is dramatically increased.

An example of a laminated storage battery will be described with reference to FIG. 8B.

Figure 8B:
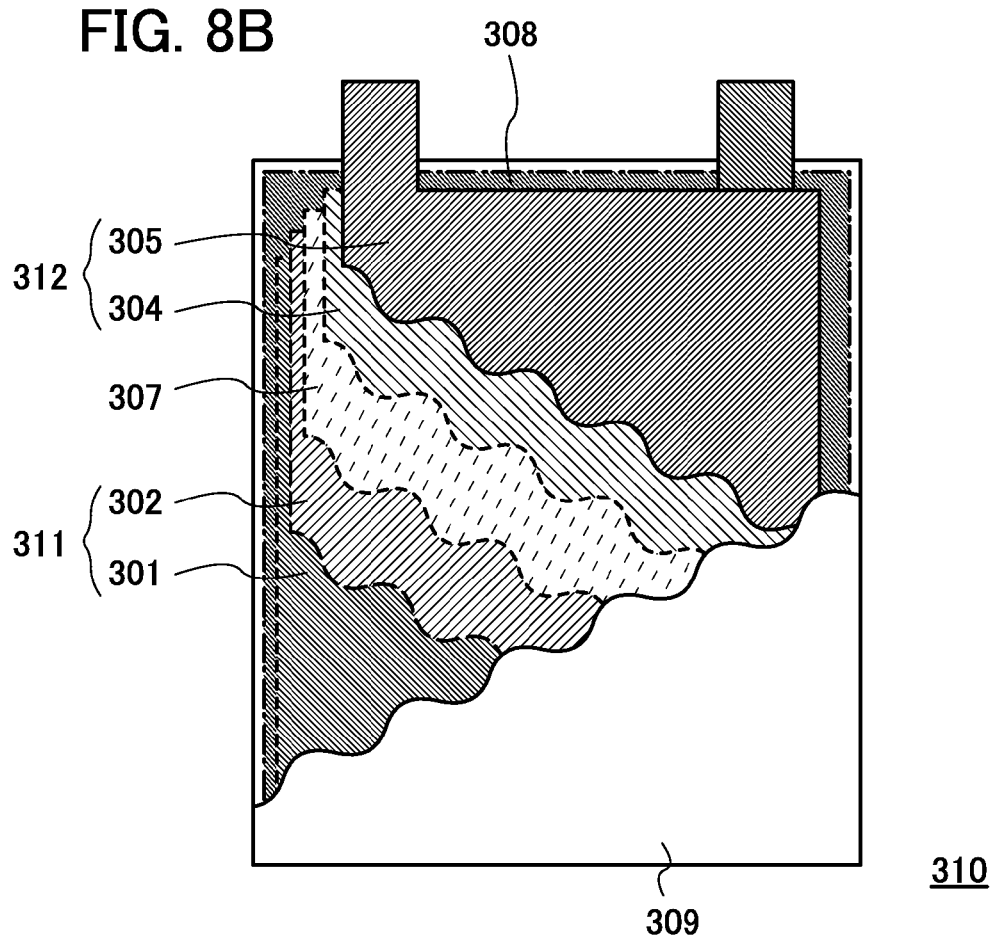

A laminated storage battery 310 illustrated in FIG. 8B includes the positive electrode 311 which includes the positive electrode current collector 301 and the positive electrode active material layer 302, the negative electrode 312 which includes the negative electrode current collector 305 and the negative electrode active material layer 304, a separator 307, the electrolytic solution 308, and an exterior body 309. The separator 307 is placed between the positive electrode 311 and the negative electrode 312 provided in the exterior body 309. The exterior body 309 is filled with the electrolytic solution 308.

As the separator 307, an insulator such as cellulose (paper), polyethylene with pores, or polypropylene with pores. The separator 307 is impregnated with the electrolytic solution 308.

In the laminated storage battery 310 illustrated in FIG. 8B, the positive electrode current collector 301 and the negative electrode current collector 305 also function as terminals for electrical contact with an external portion. For this reason, each of the positive electrode current collector 301 and the negative electrode current collector 305 is provided so as to be partly exposed on the outside of the exterior body 309.

As the exterior body 309 in the laminated storage battery 310, for example, a laminate film having a three-layer structure where a highly flexible metal thin film of aluminum, stainless steel, copper, nickel, or the like is provided over a film formed of a material such as polyethylene, polypropylene, polycarbonate, ionomer, or polyamide, and an insulating synthetic resin film of a polyamide resin, a polyester resin, or the like is provided as the outer surface of the exterior body over the metal thin film can be used. With such a three-layer structure, permeation of an electrolytic solution and a gas can be blocked and an insulating property and resistance to the electrolytic solution can be obtained.

Although a lithium secondary battery is used as an example of the storage battery of this embodiment, an electric double layer capacitor may be used as another example of the storage battery of this embodiment.

The structures, methods, and the like described in this embodiment can be combined as appropriate with any of the structures, methods, and the like described in the other embodiments.

Embodiment 3

In this embodiment, the transistor where an oxide semiconductor is used for a channel formation region, which has been described in Embodiment 1, will be described.

Figure 9:
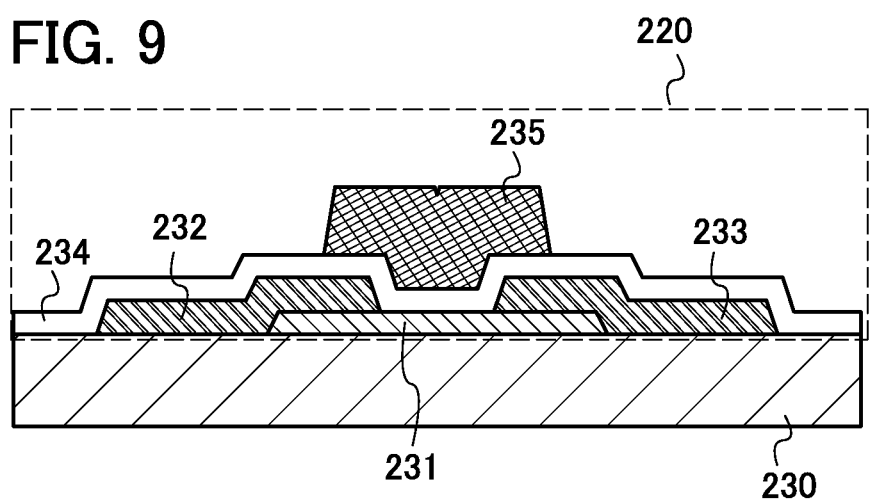
FIG. 9 is a cross-sectional view of an oxide semiconductor transistor.

FIG. 9 illustrates a structure example of a transistor where an oxide semiconductor is used for a channel formation region. A transistor 220 in FIG. 9 includes an oxide semiconductor layer 231 over a layer 230 having an insulating surface, a conductive layer 232 in contact with one end of the oxide semiconductor layer 231, a conductive layer 233 in contact with the other end of the oxide semiconductor layer 231, an insulating layer 234 over the oxide semiconductor layer 231 and the conductive layers 232 and 233, and a conductive layer 235 over the insulating layer 234. Note that in the transistor 220 in FIG. 9, the conductive layers 232 and 233 function as a source and a drain, the insulating layer 234 functions as a gate insulating film, and the conductive layer 235 functions as a gate.

<Specific Example of Oxide Semiconductor Layer 231>
<<Oxide Semiconductor Material>>

A film containing at least indium can be used as the oxide semiconductor layer 231. In particular, a film containing indium and zinc is preferably used. Moreover, a film containing gallium as a stabilizer for reducing variations in electric characteristics of the transistor in addition to indium and zinc is preferably used. Note that in the following description, an oxide semiconductor layer may be referred to as an oxide semiconductor film.

Alternatively, a film which contains, as a stabilizer, one or more of tin, hafnium, aluminum, and zirconium, and lanthanoid such as lanthanum, cerium, praseodymium, neodymium, samarium, europium, gadolinium, terbium, dysprosium, holmium, erbium, thulium, ytterbium, and lutetium can be used as the oxide semiconductor layer 231.

As the oxide semiconductor layer 231, for example, the following can be used: an indium oxide film, a two-component metal oxide film such as an In—Zn-based oxide film, an In—Mg-based oxide film, or an In—Ga-based oxide film, a three-component metal oxide film such as an In—Ga—Zn-based oxide film, an In—Al—Zn-based oxide film, an In—Sn—Zn-based oxide film, an In—Hf—Zn-based oxide film, an In—La—Zn-based oxide film, an In—Ce—Zn-based oxide film, an In—Pr—Zn-based oxide film, an In—Nd—Zn-based oxide film, an In—Sm—Zn-based oxide film, an In—Eu—Zn-based oxide film, an In—Gd—Zn-based oxide film, an In—Tb—Zn-based oxide film, an In—Dy—Zn-based oxide film, an In—Ho—Zn-based oxide film, an In—Er—Zn-based oxide film, an In—Tm—Zn-based oxide film, an In—Yb—Zn-based oxide film, or an In—Lu—Zn-based oxide film, or a four-component metal oxide film such as an In—Sn—Ga—Zn-based oxide film, an In—Hf—Ga—Zn-based oxide film, an In—Al—Ga—Zn-based oxide film, an In—Sn—Al—Zn-based oxide film, an In—Sn—Hf—Zn-based oxide film, or an In—Hf—Al—Zn-based oxide film.

Here, for example, an "In—Ga—Zn-based oxide" means an oxide containing In, Ga, and Zn as its main component and there is no particular limitation on the ratio of In, Ga, and Zn. Further, the In—Ga—Zn-based oxide may contain a metal element other than In, Ga, and Zn.

Nitrogen may be substituted for part of constituent oxygen of the oxide semiconductor layer 231.

<<Crystal Structure of Oxide Semiconductor>>

As the oxide semiconductor layer 231, a film having a single crystal structure, a polycrystalline structure, an amorphous structure, or the like can be used. Alternatively, a CAAC-OS (c-axis aligned crystalline oxide semiconductor) film can be used as the oxide semiconductor layer 231.

A structure of an oxide semiconductor film will be described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film will be described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

<<Layer Structure of Oxide Semiconductor>>

As the oxide semiconductor layer 231, a single-layer oxide semiconductor film or a stack having plural kinds of oxide semiconductor films can be used. For example, a layer including at least two of an amorphous oxide semiconductor film, a polycrystalline oxide semiconductor film, and a CAAC-OS film can be used as the oxide semiconductor layer 231.

Alternatively, a layer formed of a stack of oxide semiconductor films having different compositions can be used as the oxide semiconductor layer 231. Specifically, a layer including a first oxide semiconductor film (hereinafter also referred to as an upper layer) which is provided on the insulating layer 234 side and a second oxide semiconductor film (hereinafter also referred to as a lower layer) which is provided on the insulating surface layer 230 side and has a composition different from that of the first oxide semiconductor film can be used as the oxide semiconductor layer 231.

<Specific Examples of Conductive Layers 232 and 233>

For each of the conductive layers 232 and 233, a film containing an element selected from aluminum, copper, titanium, tantalum, tungsten, molybdenum, chromium, neodymium, and scandium, a film of an alloy containing any of these elements, a film of a nitride containing any of these elements, or the like can be used. Alternatively, the conductive layers 232 and 233 can each be formed with a stack of these films.

<Specific Example of Insulating Layer 234>

As the insulating layer 234, an inorganic insulating material film such as a silicon oxide film, a silicon nitride film, a silicon oxynitride film, a silicon nitride oxide film, an aluminum oxide film, an aluminum oxynitride film, or a gallium oxide film can be used. Alternatively, a stack of layers of these materials can be used. Note that it is preferable to use an aluminum oxide film for the insulating layer 234. An aluminum oxide film has a high shielding (blocking) effect of preventing penetration of oxygen and an impurity such as hydrogen. Therefore, when a layer including an aluminum oxide film is used as the insulating layer 234, it is possible to prevent release of oxygen from the oxide semiconductor layer 231 and entry of an impurity such as hydrogen into the oxide semiconductor layer 231.

Alternatively, as the insulating layer 234, a film including a hafnium oxide film, a yttrium oxide film, a hafnium silicate ($HfSi_xO_y$ ($x>0$, $y>0$)) film, a hafnium silicate film to which nitrogen is added, a hafnium aluminate ($HfAl_xO_y$ ($x>0$, $y>0$)) film, or a lanthanum oxide film (a film formed of what is called a high-k material) can be used. The use of such a film allows a reduction in gate leakage current.

<Specific Example of Conductive Layer 235>

As the conductive layer 235, a film containing an element selected from aluminum, copper, titanium, tantalum, tungsten, molybdenum, chromium, neodymium, and scandium or a film of an alloy containing any of these elements as its component can be used. Alternatively, the conductive layer 235 can be formed using a metal oxide containing nitrogen, specifically, an In—Ga—Zn-based oxide film containing nitrogen, an In—Sn-based oxide film containing nitrogen, an In—Ga-based oxide film containing nitrogen, an In—Zn-based oxide film containing nitrogen, a Sn-based oxide film containing nitrogen, an In-based oxide film containing nitrogen, or a metal nitride (e.g., InN or SnN) film. Such a nitride film has a work function higher than or equal to 5 eV (electron volts), preferably higher than or equal to 5.5 eV (electron volts), and the use of this film as the gate enables the threshold voltage of a transistor to be positive. Accordingly, a normally-off switching element can be obtained. Alternatively, the conductive layer 235 can be formed with a stack of these films.

In the transistor 220 illustrated in FIG. 9, it is preferable to suppress entry of impurities into the oxide semiconductor layer 231 and release of constituent element of the oxide semiconductor layer 231. This is because the electrical characteristics of the transistor 220 are changed when such a phenomenon occurs. In order to suppress this phenomenon, insulating layers having a high blocking effect can be provided above and below the transistor 220 (between the layer 230 having an insulating surface and the transistor 220, and over the insulating layer 234 and the conductive layer 235). For example, as the insulating layers, an inorganic insulating material film such as a silicon oxide film, a silicon nitride film, a silicon oxynitride film, a silicon nitride oxide film, an aluminum oxide film, an aluminum oxynitride film, or a gallium oxide film can be used. Alternatively, a stack of layers of these materials can be used.

The transistor 220 in which the oxide semiconductor layer 231 is used for a channel formation region in FIG. 9 can be used as the transistor 102 described in Embodiment 1. The off-state current of the transistor 220 where the oxide semiconductor layer 231 is used for a channel formation region is low. Thus, charge accumulated in the capacitor 103 can be prevented from leaking through the source and the drain of the transistor 220 (transistor 102) when the transistor 220 (transistor 102) is off.

<Layered Structure of Silicon Transistor and Oxide Semiconductor Transistor>

A structural example of a semiconductor device formed by stacking a transistor 902 where an oxide semiconductor is used for a channel formation region and a transistor 901 where a single crystal silicon wafer is used for a channel formation region will be described below with reference to FIG. 10. The transistor 902 can be used as the transistor 102 described in Embodiment 1, or the like. The transistor 901 can be used as a transistor included in the voltage-to-current converter circuit 105 in Embodiment 1; a transistor included in the hysteresis comparator 107 in Embodiment 1; the transistor 155 in the power supply control circuit 150 in Embodiment 1; a transistor included in the control circuit 170 in Embodiment 1; a transistor included in the control circuit 180 in Embodiment 1; a transistor included in the counter circuit 181 in Embodiment 1; a transistor included in the oscillator circuit 182 in Embodiment 1; a transistor included in the microcomputer 185 in Embodiment 1; a transistor included in the microcomputer 190 in Embodiment 1; or the like.

Note that the transistor 901 can be formed using silicon or a semiconductor material such as germanium, silicon germanium, or single crystal silicon carbide. For example, the transistor including silicon can be formed using a silicon thin film which is formed by an SOI method, a silicon thin film which is formed by a vapor deposition method, or the like. In that case, a glass substrate formed by a fusion process or a float process, a quartz substrate, a semiconductor substrate, a ceramic substrate, or the like can be used as a substrate. As the glass substrate, a glass substrate having a strain point of 730° C. or higher is preferably used in the case where the temperature of heat treatment performed later is high.

Figure 10:
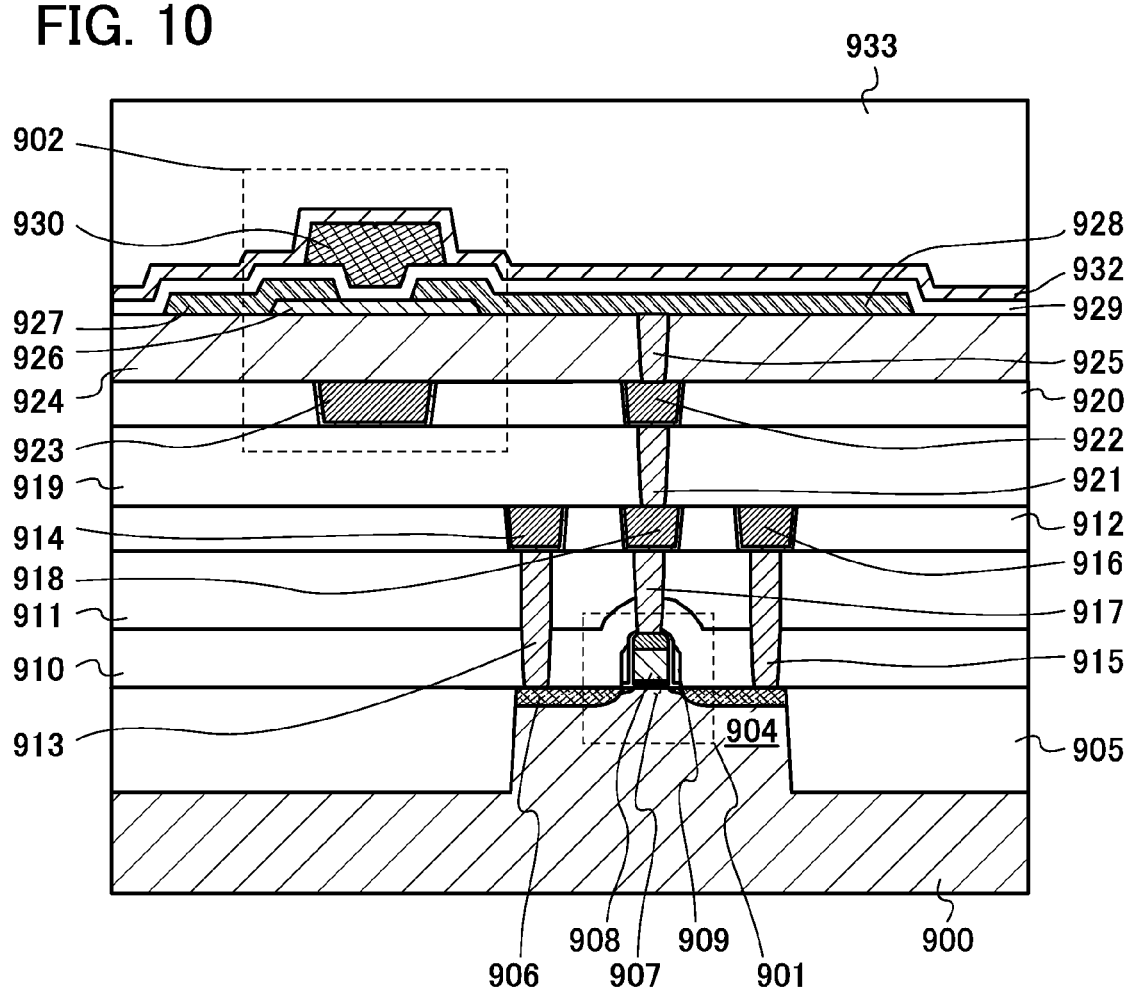
FIG. 10 illustrates a structural example of a semiconductor device.

The semiconductor device illustrated in FIG. 10 includes the transistor 901 including a single crystal silicon wafer and the transistor 902 including an oxide semiconductor in a level higher than the level of the transistor 901. In other words, the semiconductor device described in this embodiment is a semiconductor device that has a three-dimensional layered structure in which a silicon wafer is used as a substrate and a transistor layer is provided above the silicon wafer. Moreover, the semiconductor device described in this embodiment is a hybrid semiconductor device including a transistor in which silicon is used for a channel formation region and a transistor in which an oxide semiconductor is used for a channel formation region.

Either an n-channel transistor (NMOSFET) or a p-channel transistor (PMOSFET) can be used as the transistor 901 formed using a substrate 900 containing a semiconductor material. In the example illustrated in FIG. 10, the transistor 901 is electrically isolated from other elements by an element isolation region 905 formed by a shallow trench isolation (STI) method. The use of the element isolation region 905 allows a reduction in the size of the element isolation portion, and the like. On the other hand, in a semiconductor device which is not required to be structurally miniaturized or downsized, the element isolation region 905 is not necessarily formed by an STI method, and an element isolation method such as LOCOS may be used. In the substrate 900 where the transistor 901 is formed, a well 904 to which an impurity imparting conductivity, such as boron, phosphorus, or arsenic, is added is formed.

The transistor 901 in FIG. 10 includes a channel formation region in the substrate 900, impurity regions 906 (also referred to as a source region and a drain region) which are provided such that the channel formation region is provided therebetween, a gate insulating film 907 which is over the channel formation region, and a gate electrode layer 908 which is over the gate insulating film 907 and overlaps with the channel formation region. The gate electrode layer 908 can have a layered structure of a gate electrode layer including a first material for increasing processing accuracy and a gate electrode layer including a second material for reducing the resistance as a wiring. For example, the gate electrode layer 908 can have a layered structure of nickel silicide and crystalline silicon to which an impurity imparting conductivity, such as phosphorus, is added. Note that the structure is not limited to this, and materials, the number of stacked layers, the shape, or the like can be adjusted as appropriate depending on required specifications.

Note that the transistor 901 illustrated in FIG. 10 may be a fin-type transistor. In a fin-type structure, part of a semiconductor substrate is processed into a plate-shaped protrusion, and a gate electrode layer is provided to cross the protrusion in the longitudinal direction. The gate electrode layer covers the upper surface and side surfaces of the protrusion with a gate insulating film placed between the gate electrode layer and the protrusion. The use of a fin-type transistor as the transistor 901 allows a reduction in the channel width to achieve higher integration of transistors. Moreover, a larger amount of current can flow through the transistor and the control efficiency can be increased, so that the off-state current and threshold voltage of the transistor can be reduced.

Contact plugs 913 and 915 are connected to the impurity regions 906 in the substrate 900. Here, the contact plugs 913 and 915 also function as source and drain electrodes of the transistor 901 to which the contact plugs 913 and 915 are connected. In addition, impurity regions that are different from the impurity regions 906 are provided between the impurity regions 906 and the channel formation region. The impurity regions function as LDD regions or extension regions for controlling the distribution of an electric field in the vicinity of the channel formation region, depending on the concentration of an impurity introduced thereto. Sidewall insulating films 909 are provided at side surfaces of the gate electrode layer 908 with an insulating film placed therebetween. The use of this insulating film and the sidewall insulating films 909 allows formation of the LDD regions or extension regions.

The transistor 901 is covered with an insulating film 910. The insulating film 910 can function as a protective film and can prevent impurities from entering the channel formation region from the outside. With the insulating film 910 formed by a CVD method using a material such as silicon nitride, hydrogenation can be performed by heat treatment in the case where single crystal silicon is used for the channel formation region. When an insulating film having tensile stress or compressive stress is used as the insulating film 910, distortion can be provided to the semiconductor material used for the channel formation region. By application of tensile stress to a silicon material used for the channel formation region of an n-channel transistor or application of compressive stress to a silicon material used for the channel formation region of a p-channel transistor, the field-effect mobility of the transistor can be increased.

An insulating film 911 is provided over the insulating film 910, and a surface of the insulating film 911 is planarized by CMP. Accordingly, element layers in levels higher than the level including the transistor 901 can be stacked with high accuracy.

A layer including the transistor 902 in which an oxide semiconductor is used for a channel formation region is formed above the layer including the transistor 901. The transistor 902 is a top-gate transistor. The transistor 902 includes a source electrode layer 927 and a drain electrode layer 928 in contact with side surfaces and the upper surface of an oxide semiconductor film 926, and includes a gate electrode layer 930 over a gate insulating film 929 placed over the oxide semiconductor film 926, the source electrode layer 927, and the drain electrode layer 928. An insulating film 932 and an insulating film 933 are formed so as to cover the transistor 902. The oxide semiconductor film 926 is formed over an insulating film 924. The insulating film 924 can be formed using an inorganic insulating film of silicon oxide, silicon nitride, silicon nitride oxide, silicon oxynitride, aluminum oxide, aluminum nitride, aluminum nitride oxide, or the like.

Further, oxide conductive films functioning as source and drain regions may be provided between the oxide semiconductor film 926 and the source and drain electrode layers 927 and 928. A material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used. The gate insulating film 929 is formed so as to cover the source and drain electrode layers 927 and 928 and the oxide semiconductor film 926. Then, the gate electrode layer 930 is formed over the gate insulating film 929 so as to overlap with the oxide semiconductor film 926.

Note that the transistor 902 is described as a single-gate transistor; if necessary, it is possible to fabricate a multi-gate transistor that includes a plurality of gate electrodes electrically connected to each other and thus includes a plurality of channel formation regions.

Note that in this embodiment, the transistor 902 has a top-gate structure. The transistor 902 includes a back-gate electrode layer 923. With the back-gate electrode layer 923, normally-off characteristics of the transistor 902 can be further achieved. For example, when the potential of the back-gate electrode layer 923 is set to GND or a fixed potential, the threshold voltage of the transistor 902 can be further shifted in the positive direction, so that the transistor 902 can have more excellent normally-off characteristics.

In order to form an electrical circuit by electrically connecting the transistor 901 and the transistor 902 to each other, wiring layers for connection each having a single-layer structure or a layered structure are formed between levels and in the higher level.

In FIG. 10, one of the source and the drain of the transistor 901 is electrically connected to a wiring layer 914 through the contact plug 913. The other of the source and the drain of the transistor 901 is electrically connected to a wiring layer 916 through the contact plug 915. The gate of the transistor 901 is electrically connected to the drain electrode layer 928 of the transistor 902 through a contact plug 917, a wiring layer 918, a contact plug 921, a wiring layer 922, and a contact plug 925.

The wiring layers 914, 918, 916, and 922 and the backgate electrode layer 923 are embedded in insulating films. These wiring layers and the like are preferably formed using a low-resistance conductive material such as copper or aluminum. Alternatively, the wiring layers can be formed using graphene formed by a CVD method as a conductive material. Graphene is a one-atom thick sheet of carbon molecules having $sp^2$-bonds or a stack of 2 to 100 sheets of the carbon molecules.

The insulating films 911, 912, 919, 920, and 933 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), silicon oxide made from $Si(OC_2H_5)_4$ (tetraethylorthosilicate: TEOS), hydrogen silsesquioxane (HSQ), methyl silsesquioxane (MSQ), organosilicate glass (OSG), or an organic polymer-based material. Particularly in the case of advancing miniaturization of a semiconductor device, parasitic capacitance between wirings is significant and signal delay is increased. Therefore, the dielectric constant of silicon oxide (k=4.0 to 4.5) is too high, and it is preferable to use a material with a dielectric constant k of 3.0 or less. In addition, since CMP treatment is performed after the wirings are embedded in the insulating films, the insulating films need to have high mechanical strength. As long as their mechanical strength can be secured, the insulating films can be made porous to have a lower dielectric constant.

As described above, the transistor 902 in which the oxide semiconductor film 926 is used for the channel formation region can be used as the transistor 102 described in Embodiment 1. The off-state current of the transistor 902 in which the oxide semiconductor film 926 is used for the channel formation region is low. Thus, charge accumulated in the capacitor 103 can be prevented from leaking through the source and the drain of the transistor 902 (transistor 102) when the transistor 902 (transistor 102) is off.

The transistor 901 in which a single crystal silicon wafer is used for the channel formation region can be used as a transistor included in the voltage-to-current converter circuit 105 in Embodiment 1; a transistor included in the hysteresis comparator 107 in Embodiment 1; the transistor 155 in the power supply control circuit 150 in Embodiment 1; a transistor included in the control circuit 170 in Embodiment 1; a transistor included in the control circuit 180 in Embodiment 1; a transistor included in the counter circuit 181 in Embodiment 1; a transistor included in the oscillator circuit 182 in Embodiment 1; a transistor included in the microcomputer 185 in Embodiment 1; a transistor included in the microcomputer 190 in Embodiment 1; or the like. Stacking the transistor 901 and the transistor 902 permits a reduction in area occupied by a charging device.

Although not illustrated, not only the transistor 901 and the transistor 902 but also the capacitor 103 can be stacked. For example, the capacitor 103 may be formed with a stack of the conductive film in the same layer as the source electrode layer 927 and the drain electrode layer 928, the insulating film in the same layer as the gate insulating film 929, and the conductive film in the same layer as the gate electrode layer 930. Stacking the transistor 901, the transistor 902, and the capacitor 103 permits a reduction in area occupied by a charging device.

The structures, methods, and the like described in this embodiment can be combined as appropriate with any of the structures, methods, and the like described in the other embodiments.

This application is based on Japanese Patent Application serial no. 2012-158370 filed with Japan Patent Office on Jul. 17, 2012, the entire contents of which are hereby incorporated by reference.

What is claimed is:

1. A semiconductor device comprising:
   a transistor;
   a capacitor;
   a comparator; and
   a current detection circuit,
   wherein a charging current is supplied from a power source to a storage battery,
   wherein a current which depends on the charging current is supplied to the capacitor through the transistor,
   wherein charge corresponding to the current which depends on the charging current is accumulated to the capacitor,
   wherein the comparator is configured to output a signal to terminate the supply of the charging current from the power source to the storage battery when a potential of a terminal of the capacitor electrically connected to a terminal of the transistor and an input terminal of the comparator reaches a reference potential,
   wherein the current detection circuit comprises a resistor and a voltage-to-current converter circuit,
   wherein the resistor is configured to flow the charging current from the power source to the storage battery through a first terminal of the resistor and a second terminal of the resistor, and
   wherein the voltage-to-current converter circuit is configured to supply the current which depends on the charging current to the transistor in accordance with a potential difference between the first terminal of the resistor and the second terminal of the resistor.

2. The semiconductor device according to claim 1,
   wherein the current depending on the charging current is supplied to the capacitor through the transistor when the transistor is on.

3. The semiconductor device according to claim 2,
   wherein the transistor comprises a channel formation region comprising an oxide semiconductor.

4. The semiconductor device according to claim 1,
   wherein the transistor comprises a channel formation region comprising an oxide semiconductor.

5. A semiconductor device comprising:
   a power source;
   a transistor;
   a capacitor;
   a comparator; and
   a current detection circuit,
   wherein a charging current is supplied from the power source to a storage battery,
   wherein a current which depends on the charging current is supplied to the capacitor through the transistor,
   wherein charge corresponding to the current which depends on the charging current is accumulated to the capacitor, wherein the comparator is configured to output a signal to terminate the supply of the charging current from the power source to the storage battery when a potential of a terminal of the capacitor electrically connected to a terminal of the transistor and an input terminal of the comparator reaches a reference potential, wherein the current detection circuit comprises a resistor and a voltage-to-current converter circuit, wherein the resistor is configured to flow the charging current from the power source to the storage battery through a first terminal of the resistor and a second terminal of the resistor, and wherein the voltage-to-current converter circuit is configured to supply the current which depends on the charging current to the transistor in accordance with a potential difference between the first terminal of the resistor and the second terminal of the resistor.

6. The semiconductor device according to claim 5, wherein the current depending on the charging current is supplied to the capacitor through the transistor when the transistor is on.

7. The semiconductor device according to claim 6, wherein the transistor comprises a channel formation region comprising an oxide semiconductor.

8. The semiconductor device according to claim 5, wherein the transistor comprises a channel formation region comprising an oxide semiconductor.

9. A semiconductor device comprising:

a power source;
a storage battery;
a transistor;
a capacitor;
a comparator; and
a current detection circuit, wherein a charging current is supplied from the power source to the storage battery, wherein a current which depends on the charging current is supplied to the capacitor through the transistor, wherein charge corresponding to the current which depends on the charging current is accumulated to the capacitor, wherein the comparator is configured to output a signal to terminate the supply of the charging current from the power source to the storage battery when a potential of a terminal of the capacitor electrically connected to a terminal of the transistor and an input terminal of the comparator reaches a reference potential, wherein the current detection circuit comprises a resistor and a voltage-to-current converter circuit, wherein the resistor is configured to flow the charging current from the power source to the storage battery through a first terminal of the resistor and a second terminal of the resistor, and wherein the voltage-to-current converter circuit is configured to supply the current which depends on the charging current to the transistor in accordance with a potential difference between the first terminal of the resistor and the second terminal of the resistor.

10. The semiconductor device according to claim 9, wherein the current depending on the charging current is supplied to the capacitor through the transistor when the transistor is on.

11. The semiconductor device according to claim 10, wherein the transistor comprises a channel formation region comprising an oxide semiconductor.

12. The semiconductor device according to claim 9, wherein the transistor comprises a channel formation region comprising an oxide semiconductor.

* * * * *